(12) United States Patent
Valavala et al.

(10) Patent No.: US 12,347,780 B2
(45) Date of Patent: Jul. 1, 2025

(54) INTEGRATED CIRCUIT PACKAGE WITH FLIPPED HIGH BANDWIDTH MEMORY DEVICE

(71) Applicant: Intel Corporation, Santa Clara, CA (US)

(72) Inventors: Krishna Vasanth Valavala, Chandler, AZ (US); Chandra Mohan Jha, Tempe, AZ (US); Andrew Paul Collins, Chandler, AZ (US); Omkar G. Karhade, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 778 days.

(21) Appl. No.: 17/475,726

(22) Filed: Sep. 15, 2021

(65) Prior Publication Data

US 2023/0081139 A1   Mar. 16, 2023

(51) Int. Cl.
| | | |
|---|---|---|
| *H01L 23/538* | (2006.01) | |
| *H01L 23/367* | (2006.01) | |
| *H01L 25/00* | (2006.01) | |
| *H01L 25/065* | (2023.01) | |
| *H01L 25/18* | (2023.01) | |

(52) U.S. Cl.
CPC ........ *H01L 23/5381* (2013.01); *H01L 23/367* (2013.01); *H01L 23/5384* (2013.01); *H01L 23/5386* (2013.01); *H01L 25/0652* (2013.01); *H01L 25/18* (2013.01); *H01L 25/50* (2013.01); *H01L 2225/06513* (2013.01); *H01L 2225/06589* (2013.01)

(58) Field of Classification Search
CPC .............. H01L 23/5381; H01L 23/367; H01L 23/5384; H01L 23/5386; H01L 25/0652; H01L 25/18; H01L 25/50; H01L 2225/06513; H01L 2225/06589
See application file for complete search history.

(56) References Cited

U.S. PATENT DOCUMENTS

| | | | |
|---|---|---|---|
| 2020/0111720 A1 | 4/2020 | Wan et al. | |
| 2020/0168550 A1* | 5/2020 | Ryu | .................... H01L 23/5383 |
| 2021/0118756 A1 | 4/2021 | Wan et al. | |

* cited by examiner

*Primary Examiner* — Peniel M Gumedzoe
(74) *Attorney, Agent, or Firm* — Akona IP PC

(57) ABSTRACT

An example microelectronic assembly includes a substrate, a bridge die over the substrate, and a die stack between the substrate and the bridge die, the die stack including a logic die and at least one memory die, where the logic die is between the at least one memory die and the bridge die.

20 Claims, 9 Drawing Sheets

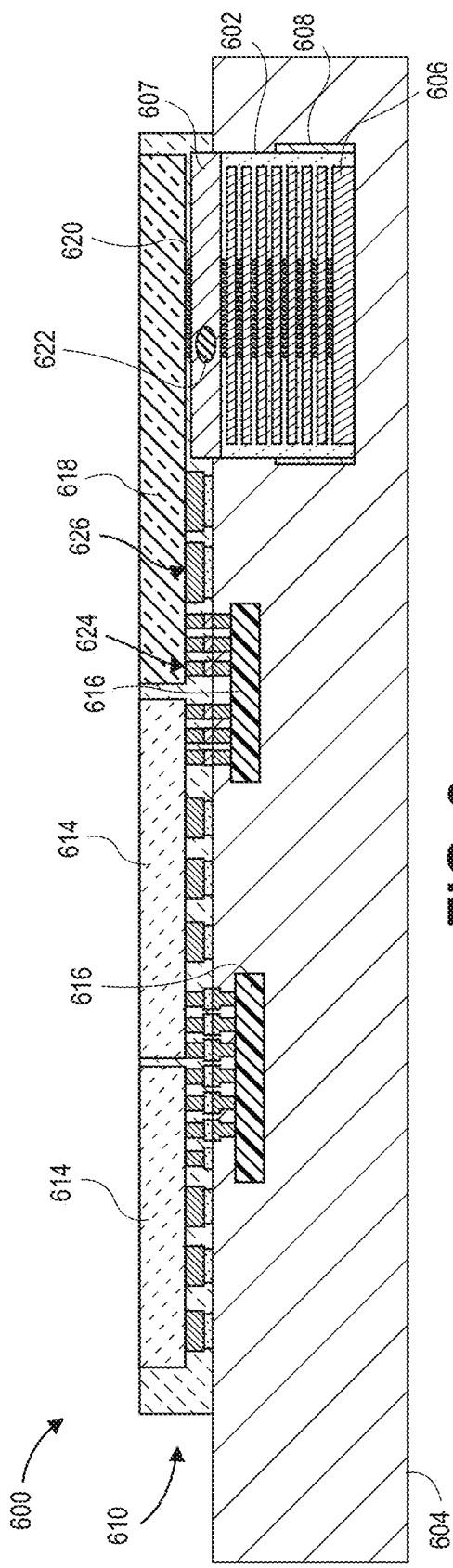
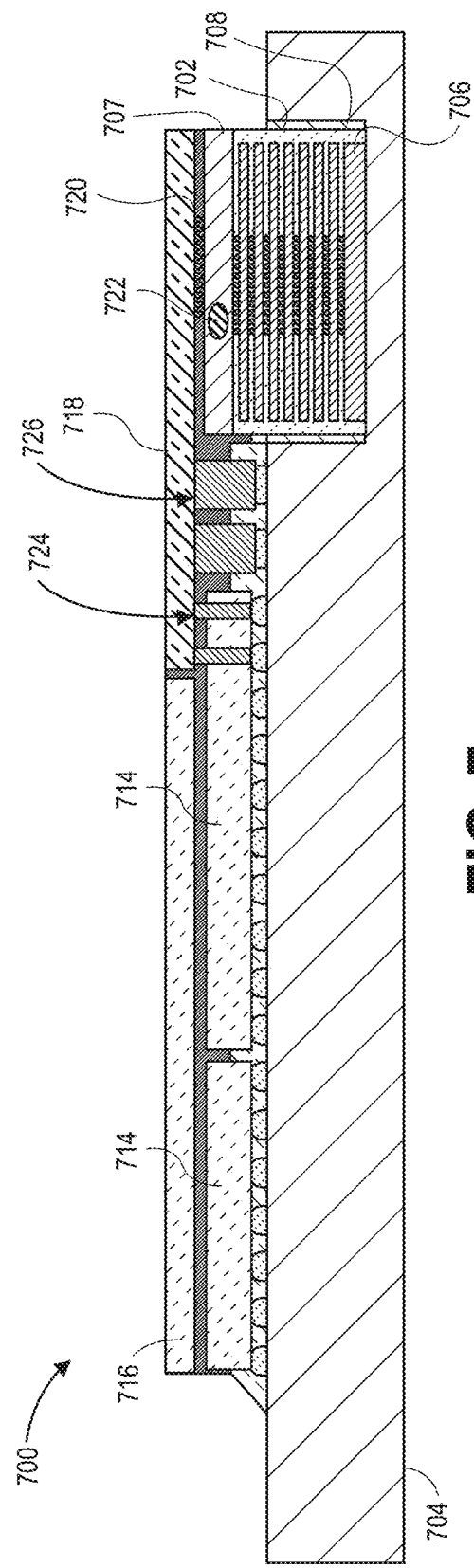
FIG. 6
FIG. 7

INTEGRATED CIRCUIT PACKAGE WITH FLIPPED HIGH BANDWIDTH MEMORY DEVICE

TECHNICAL FIELD

The present disclosure relates to integrated circuit (IC) devices and assemblies. More specifically, it relates to IC packages with inverted chip stacks.

BACKGROUND

For the past several decades, the scaling of features in ICs has been a driving force behind an ever-growing semiconductor industry. Scaling to smaller and smaller features enables increased densities of functional units on the limited real estate of semiconductor chips. For example, shrinking transistor size allows for the incorporation of an increased number of memory or logic devices on a chip, lending to the fabrication of products with increased capacity. The drive for the ever-increasing capacity, however, is not without issue. The necessity to optimize the performance of each IC die and each IC package that includes one or more dies becomes increasingly significant.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

FIG. 6 is a schematic cross-sectional view of another example IC package including a microelectronic assembly such as illustrated in FIG. 1, according to some embodiments of the present disclosure.

FIG. 7 is a schematic cross-sectional view of another example IC package including a microelectronic assembly such as illustrated in FIG. 1, according to some embodiments of the present disclosure.

DETAILED DESCRIPTION

Overview

Figure 1:
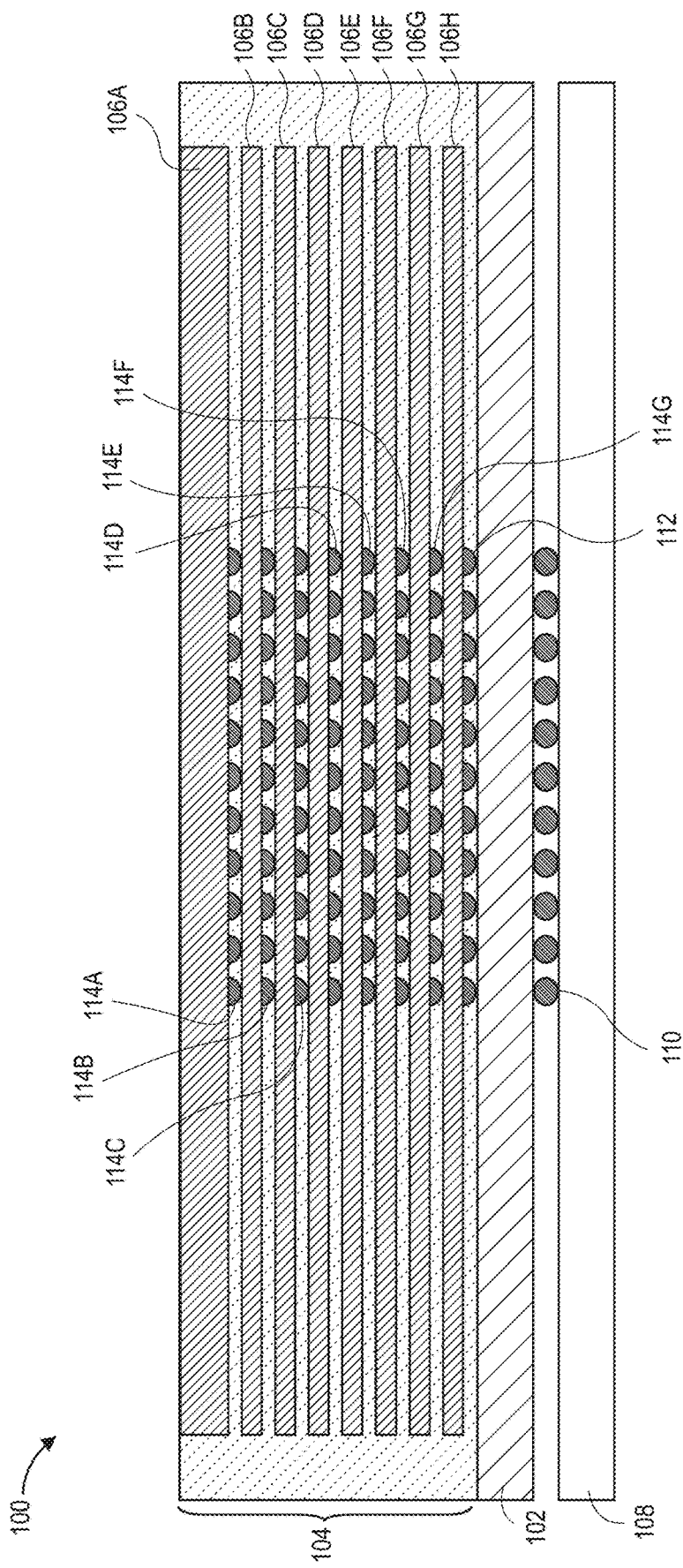
FIG. 1 is a schematic cross-sectional view of a microelectronic assembly including a base die and one or more stacks of one or more memory and/or compute dies that may be stacked over the base die, according to some embodiments of the present disclosure.

The systems, methods, and devices of this disclosure each have several innovative aspects, no single one of which is solely responsible for all desirable attributes disclosed herein. Details of one or more implementations of the subject matter described in this specification are set forth in the description below and the accompanying drawings.

In one aspect of the present disclosure, an example microelectronic assembly includes a substrate; a bridge die over the substrate; and a die stack between the substrate and the bridge die, where the die stack includes a logic die and at least one memory die, and where the logic die is between the at least one memory die and the bridge die.

As used herein, the term "insulating material" refers to solid materials (and/or liquid materials that solidify after processing as described herein) that are substantially electrically nonconducting. They may include, as examples and not as limitations, organic polymers and plastics, and inorganic materials such as ionic crystals, porcelain, glass, silicon and alumina or a combination thereof. They may include dielectric materials, high polarizability materials, and/or piezoelectric materials. They may be transparent or opaque without departing from the scope of the present disclosure. Further examples of insulating materials are underfills and molds or mold-like materials used in packaging applications, including for example, materials used in organic interposers, package substrates and other such components.

Each of the structures, assemblies, packages, methods, devices, and systems of the present disclosure may have several innovative aspects, no single one of which is solely responsible for all the desirable attributes disclosed herein. Details of one or more implementations of the subject matter described in this specification are set forth in the description below and the accompanying drawings.

In the following detailed description, various aspects of the illustrative implementations may be described using terms commonly employed by those skilled in the art to convey the substance of their work to others skilled in the art. For example, the term "connected" means a direct connection (which may be one or more of a mechanical, electrical, and/or thermal connection) between the things that are connected, without any intermediary devices, while the term "coupled" means either a direct connection between the things that are connected, or an indirect connection through one or more passive or active intermediary devices. The term "circuit" means one or more passive and/or active components that are arranged to cooperate with one another to provide a desired function. The terms "substantially," "close," "approximately," "near," and "about," generally refer to being within +/−20% of a target value (e.g., within +/−5 or 10% of a target value) based on the context of a particular value as described herein or as known in the art. Similarly, terms indicating orientation of various elements, e.g., "coplanar," "perpendicular," "orthogonal," "parallel," or any other angle between the elements, generally refer to being within +/−5-20% of a target value based on the context of a particular value as described herein or as known in the art.

Unless described otherwise, dies described herein include one or more IC structures (or, simply, "ICs") implementing (i.e., configured to perform) certain functionality. In one such example, the term "memory die" may be used to describe a die that includes one or more ICs implementing memory circuitry (e.g., ICs implementing one or more of memory devices, memory arrays, control logic configured to control the memory devices and arrays, etc.). In another such example, the term "compute die" may be used to describe a die that includes one or more ICs implementing logic/compute circuitry (e.g., ICs implementing one or more of I/O functions, arithmetic operations, pipelining of data, etc.).

In other example, the term "interconnect" may be used to describe any element formed of an electrically conductive material for providing electrical connectivity to one or more components associated with an IC or/and between various such components. In context of an IC die/chip, the term "interconnect" may refer to both conductive lines/wires (also sometimes referred to as "lines" or "metal lines" or "trenches") and conductive vias (also sometimes referred to as "vias" or "metal vias"). In general, a term "conductive line" may be used to describe an electrically conductive element isolated by a dielectric material typically comprising an interlayer low-k dielectric that is provided within the plane of the IC die/chip. Such conductive lines are typically arranged in several levels, or several layers, of metallization stacks. On the other hand, the term "conductive via" may be used to describe an electrically conductive element that interconnects two or more conductive lines of different levels of a metallization stack. To that end, a via may be provided substantially perpendicularly to the plane of an IC die/chip or a support structure over which an IC structure is provided and may interconnect two conductive lines in adjacent levels or two conductive lines in not adjacent levels. A term "metallization stack" may be used to refer to a stack of one or more interconnects for providing connectivity to different circuit components of an IC die/chip. Sometimes, metal lines and vias may be referred to as "conductive lines/traces" and "conductive vias", respectively, to highlight the fact that these elements include electrically conductive materials such as, but not limited to, metals. On the other hand, in context of a stack of dies coupled to one another or in context of a die coupled to a package substrate, the term "interconnect" may refer to, respectively, to DTD interconnects and die-to-package substrate (DTPS) interconnects.

In various embodiments, elements associated with an IC may include, for example, transistors, diodes, power sources, resistors, capacitors, inductors, sensors, transceivers, receivers, antennas, etc. In various embodiments, components associated with an IC may include those that are monolithically integrated within an IC, mounted on an IC, or those connected to an IC. The ICs described herein may be either analog or digital and may be used in a number of applications, such as microprocessors, optoelectronics, logic blocks, audio amplifiers, etc., depending on the components associated with the IC. The ICs described herein may be employed as part of a chipset for executing one or more related functions in a computer.

The terms "over," "under," "between," and "on" as used herein refer to a relative position of one material layer or component with respect to other layers or components. For example, one layer disposed over or under another layer may be directly in contact with the other layer or may have one or more intervening layers. Moreover, one layer disposed between two layers may be directly in contact with one or both of the two layers or may have one or more intervening layers. In contrast, a first layer described to be "on" a second layer refers to a layer that is in direct contact with that second layer. Similarly, unless explicitly stated otherwise, one feature disposed between two features may be in direct contact with the adjacent features or may have one or more intervening layers. In addition, the term "dispose" as used herein refers to position, location, placement, and/or arrangement rather than to any particular method of formation.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The term "between," when used with reference to measurement ranges, is inclusive of the ends of the measurement ranges. When used herein, the notation "A/B/C" means (A), (B), and/or (C). Although certain elements may be referred to in the singular herein, such elements may include multiple sub-elements. For example, "an electrically conductive material" may include one or more electrically conductive materials. In another example, "a dielectric material" may include one or more dielectric materials.

The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous. The disclosure may use perspective-based descriptions such as "above," "below," "top," "bottom," and "side"; such descriptions are used to facilitate the discussion and are not intended to restrict the application of disclosed embodiments. The accompanying drawings are not necessarily drawn to scale. Unless otherwise specified, the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

In the following detailed description, reference is made to the accompanying drawings that form a part hereof, and in which is shown, by way of illustration, embodiments that may be practiced. It is to be understood that other embodiments may be utilized, and structural or logical changes may be made without departing from the scope of the present disclosure. Therefore, the following detailed description is not to be taken in a limiting sense.

In the drawings, same reference numerals refer to the same or analogous elements/materials shown so that, unless stated otherwise, explanations of an element/material with a given reference numeral provided in context of one of the drawings are applicable to other drawings where element/materials with the same reference numerals may be illustrated.

Furthermore, in the drawings, some schematic illustrations of example structures of various devices and assemblies described herein may be shown with precise right angles and straight lines, but it is to be understood that such schematic illustrations may not reflect real-life process limitations which may cause the features to not look so "ideal" when any of the structures described herein are examined using, e.g., images of suitable characterization tools such as scanning electron microscopy (SEM) images, transmission electron microscope (TEM) images, or non-contact profilometer. In such images of real structures, possible processing and/or surface defects could also be visible, e.g., surface roughness, curvature or profile deviation, pit or scratches, not-perfectly straight edges of materials, tapered vias or other openings, inadvertent rounding of corners or variations in thicknesses of different material layers, occasional screw, edge, or combination dislocations within the crystalline region(s), and/or occasional dislocation defects of single atoms or clusters of atoms. There may be other defects not listed here but that are common within the field of device fabrication and/or packaging.

In the drawings, a particular number and arrangement of structures and components are presented for illustrative purposes and any desired number or arrangement of such structures and components may be present in various embodiments. Further, the structures shown in the figures may take any suitable form or shape according to material properties, fabrication processes, and operating conditions. For convenience, if a collection of drawings designated with different letters are present (e.g., FIGS. 10A-10C), such a collection may be referred to herein without the letters (e.g., as "FIG. 10"). Similarly, if a collection of reference numerals designated with different letters are present (e.g., 110a-110e), such a collection may be referred to herein without the letters (e.g., as "110").

Various operations may be described as multiple discrete actions or operations in turn in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

Example Embodiments

FIG. 1 is a schematic illustration of a cross-sectional side view of a microelectronic assembly 100 with a base structure, or base die, 102 and at least one stack 104 including one or more of memory and/or compute dies 106A-106H stacked over base die 102, in accordance with some embodiments. FIG. 1 illustrates a die stack 104 having eight stacked memory/compute dies 106; in other embodiments, the number of stacks and the number, the order, and the nature of the dies included in each stack may be different. For purposes of example herein, microelectronic assembly 100 (as well as similar assemblies) may be referred to herein as a high bandwidth memory (HBM) die stack.

As illustrated in FIG. 1, in some embodiments, base die 102 may be coupled to a further component 108 by interconnects 110. In some embodiments, the further component 108 may be a package substrate (e.g., a package substrate 1202, described herein), in which case the interconnects 110 may be DTPS interconnects and the microelectronic assembly 100 may be termed an IC package. In other embodiments, the further component 108 may be an interposer or another memory or compute die, in which case the interconnects 110 may be DTD interconnects. In some embodiments, the interconnects 110 may include bumps, e.g., solder bumps, and may have a pitch between about 55 and 200 micrometer (micron), including all values and ranges therein, e.g., between about 90 and 150 micron, or between about 100 and 120 micron.

Various dies 106 of the stack 104 may be coupled to one another by interconnects 114A-114G. In some embodiments, the interconnects 114 may be hybrid bonding interconnects, copper pillars, DTD interconnects, may include solder and/or may include an anisotropic conductive material. In some embodiments, through-silicon vias (TSVs) (not shown) may extend through one or more of the dies 106 and 102 to couple power and signals between the dies.

Although not specifically shown in all of the present illustrations in order to not clutter the drawings, when DTD or DTPS interconnects are described, a surface of a first die may include a first set of conductive contacts, and a surface of a second die or a package substrate may include a second set of conductive contacts. One or more conductive contacts of the first set may then be electrically and mechanically coupled to some of the conductive contacts of the second set by the DTD or DTPS interconnects. In some embodiments, the pitch of the DTD interconnects may be different from the pitch of the DTPS interconnects, although, in other embodiments, these pitches may be substantially the same.

The DTPS interconnects disclosed herein may take any suitable form. In some embodiments, a set of DTPS interconnects may include solder (e.g., solder bumps or balls that are subject to a thermal reflow to form the DTPS interconnects). DTPS interconnects that include solder may include any appropriate solder material, such as lead/tin, tin/bismuth, eutectic tin/silver, ternary tin/silver/copper, eutectic tin/copper, tin/nickel/copper, tin/bismuth/copper, tin/indium/copper, tin/zinc/indium/bismuth, or other alloys. In some embodiments, a set of DTPS interconnects may include an anisotropic conductive material, such as an anisotropic conductive film or an anisotropic conductive paste. An anisotropic conductive material may include conductive materials dispersed in a non-conductive material. In some embodiments, an anisotropic conductive material may include microscopic conductive particles embedded in a binder or a thermoset adhesive film (e.g., a thermoset biphenyl-type epoxy resin, or an acrylic-based material). In some embodiments, the conductive particles may include a polymer and/or one or more metals (e.g., nickel or gold). For example, the conductive particles may include nickel-coated gold or silver-coated copper that is in turn coated with a polymer. In another example, the conductive particles may include nickel. When an anisotropic conductive material is uncompressed, there may be no conductive pathway from one side of the material to the other. However, when the anisotropic conductive material is adequately compressed (e.g., by conductive contacts on either side of the anisotropic conductive material), the conductive materials near the region of compression may contact each other so as to form a conductive pathway from one side of the film to the other in the region of compression.

The DTD interconnects disclosed herein may take any suitable form. In some embodiments, some or all of the DTD interconnects in a microelectronic assembly or an IC package as described herein may be metal-to-metal interconnects (e.g., copper-to-copper interconnects, or plated interconnects). In such embodiments, the conductive contacts on either side of the DTD interconnect may be bonded together (e.g., under elevated pressure and/or temperature) without the use of intervening solder or an anisotropic conductive material. In some embodiments, a thin cap of solder may be used in a metal-to-metal interconnect to accommodate planarity, and this solder may become an intermetallic compound during processing. In some metal-to-metal interconnects that utilize hybrid bonding, a dielectric material (e.g., silicon oxide, silicon nitride, silicon carbide, or an organic layer) may be present between the metals bonded together (e.g., between copper pads or posts that provide the associated conductive contacts). In some embodiments, one side of a DTD interconnect may include a metal pillar (e.g., a copper pillar), and the other side of the DTD interconnect may include a metal contact (e.g., a copper contact) recessed in a dielectric. In some embodiments, a metal-to-metal interconnect (e.g., a copper-to-copper interconnect) may include a noble metal (e.g., gold) or a metal whose oxides are conductive (e.g., silver). In some embodiments, a metal-to-metal interconnect may include metal nanostructures (e.g., nanorods) that may have a reduced melting point. Metal-to-metal interconnects may be capable of reliably conducting a higher current than other types of interconnects; for example, some solder interconnects may form brittle intermetallic compounds when current flows, and the maximum current provided through such interconnects may be constrained to mitigate mechanical failure.

In some embodiments, the dies on either side of a set of DTD interconnects may be unpackaged dies, and/or the DTD interconnects may include small conductive bumps or pillars (e.g., copper bumps or pillars) attached to the respective conductive contacts by solder. In some embodiments, some or all of the DTD interconnects in a microelectronic assembly or an IC package as described herein may be solder interconnects that include a solder with a higher melting point than a solder included in some or all of the DTPS interconnects. For example, when the DTD interconnects in an IC package are formed before the DTPS interconnects are formed, solder-based DTD interconnects may use a higher-temperature solder (e.g., with a melting point above 200 degrees Celsius), while the DTPS interconnects may use a lower-temperature solder (e.g., with a melting point below 200 degrees Celsius). In some embodiments, a higher-temperature solder may include tin; tin and gold; or tin, silver, and copper (e.g., 96.5% tin, 3% silver, and 0.5% copper). In some embodiments, a lower-temperature solder may include tin and bismuth (e.g., eutectic tin bismuth) or tin, silver, and bismuth. In some embodiments, a lower-temperature solder may include indium, indium and tin, or gallium.

In some embodiments, a set of DTD interconnects may include solder. DTD interconnects that include solder may include any appropriate solder material, such as any of the materials discussed above for the DTPS interconnects. In some embodiments, a set of DTD interconnects may include an anisotropic conductive material, such as any of the materials discussed above for the DTPS interconnects. In some embodiments, the DTD interconnects may be used as data transfer lanes, while the DTPS interconnects may be used for power and ground lines, among others.

In microelectronic assemblies or IC packages as described herein, some or all of the DTD interconnects may have a finer pitch than the DTPS interconnects. In some embodiments, the DTD interconnects may have too fine a pitch to couple to the package substrate directly (e.g., too fine to serve as DTPS interconnects). The DTD interconnects may have a smaller pitch than the DTPS interconnects due to the greater similarity of materials in the different dies on either side of a set of DTD interconnects than between a die and a package substrate on either side of a set of DTPS interconnects. In particular, the differences in the material composition of dies and package substrates may result in differential expansion and contraction of the die dies and package substrates due to heat generated during operation (as well as the heat applied during various manufacturing operations). To mitigate damage caused by this differential expansion and contraction (e.g., cracking, solder bridging, etc.), the DTPS interconnects in any of the microelectronic assemblies or IC packages as described herein may be formed larger and farther apart than DTD interconnects, which may experience less thermal stress due to the greater material similarity of the pair of dies on either side of the DTD interconnects. In some embodiments, the DTPS interconnects disclosed herein may have a pitch between about 80 microns and 300 microns, while the DTD interconnects disclosed herein may have a pitch between about 7 microns and 100 microns.

Dies disclosed herein may comprise a semiconductor material including, for example, N-type or P-type materials. Dies may include, for example, a crystalline substrate formed using a bulk silicon (or other bulk semiconductor material) or a semiconductor-on-insulator (SOI, e.g., a silicon-on-insulator) structure. In some embodiments, dies may be formed using alternative materials, which may or may not be combined with silicon, that include, but are not limited to, lithium niobite, indium phosphide, silicon dioxide, germanium, silicon germanium, indium antimonide, lead telluride, indium arsenide, indium phosphide, gallium arsenide, aluminum gallium arsenide, aluminum arsenide, indium aluminum arsenide, aluminum indium antimonide, indium gallium arsenide, gallium nitride, indium gallium nitride, aluminum indium nitride or gallium antimonide, or other combinations of group III-N or group IV materials. In some embodiments, dies may comprise a non-crystalline material, such as polymers. Although a few examples of the material for dies are described here, any material or structure that may serve as a foundation upon which IC circuits and structures as described herein may be built falls within the spirit and scope of the present disclosure as dies 102.

Referring again to FIG. 1, in particular, turning to memory circuits implemented in the microelectronic assembly 100, some memory devices may be considered "standalone" devices in that they are included in a chip that does not also include computing logic (e.g., transistors for performing processing operations). Other memory devices, such as dies or die stacks, may be included in a chip package along with computing logic and may be referred to as "co-packaged" memory devices. Using co-packaged memory to support computing logic may improve performance by bringing the memory and the computing logic closer together and eliminating interfaces that increase latency. Various embodiments of the present disclosure relate to co-packaged memory arrays, as well as corresponding methods and devices. In particular, in some embodiments, the base die 102 may include a relatively large memory, coupled to one or more stack dies 106 of the stack 114. Stacking various layers in this manner advantageously allows scaling by adding more layers of memory and compute dies, as needed.

Base die 102 may include memory functionality as well as compute functionality. Memory implemented in the base die 102 may be a flat memory (also sometimes referred to as a "flat hierarchy memory" or a "linear memory") and, therefore, may also be referred to as a "basin memory." As known in the art, a flat memory or a linear memory refers to a memory addressing paradigm in which memory may appear to the program as a single contiguous address space, where a processor can directly and linearly address all of the available memory locations without having to resort to memory segmentation or paging schemes. Thus, the memory implemented in the base die 102 may be a memory that is not divided into hierarchical layer or levels in terms of access of its data. In some embodiments, at least portions of base memory functionality may be formed of backend transistors (i.e., transistors formed by back end of line (BEOL) processes), e.g., implemented as a dynamic random access memory (DRAM). On the other hand, the memory implemented in the stacked dies 104 (e.g., dies 106) may be hierarchical memory and may include different types of memory than the base die 102. For example, in some embodiments, the memory implemented in the memory dies 106 may be formed of frontend transistors (i.e., transistors formed by front end of line (FEOL) processes), e.g., SRAM. In some embodiments, some of the stack memory dies may also include DRAM. In this context, hierarchical memory refers to the concept of computer architecture where computer storage is separated into a hierarchy based on features of memory such as response time, complexity, capacity, performance, and controlling technology. Designing for high performance may require considering the restrictions of the memory hierarchy, i.e., the size and capabilities of each component. With hierarchical memory, each of the various memory components can be viewed as part of a hierarchy of memories ($m_1$, $m_2$, ..., $m_n$) in which each member m, is typically smaller and faster than the next highest member $m_{j+1}$ of the hierarchy. To limit waiting by higher levels, a lower level of a hierarchical memory structure may respond by filling a buffer and then signaling for activating the transfer. For example, in some embodiments, the hierarchical memory implemented in the stack memory dies may be separated into four major storage levels: 1) internal storage (e.g., processor registers and cache), 2) main memory (e.g., the system RAM and controller cards), and 3) on-line mass storage (e.g., secondary storage), and 4) off-line bulk storage (e.g., tertiary, and off-line storage). However, as the number of levels in the memory hierarchy and the performance at each level has increased over time and is likely to continue to increase in the future, this example hierarchical division provides only one non-limiting example of how the memory dies may be arranged.

In some embodiments, base die 102 may be responsible for read/write operations with respect to the data stored in the memory dies 106. To that end, the base die 102 may include one or more I/O ICs configured to control access to data stored in the memory dies 106. For example, the base die 102 may be configured to only control I/O access to data but not perform any operations on the data. In some embodiments, one or more additional compute dies may be included in the stack 104, where the additional compute dies may implement ICs configured to implement I/O control of data stored in the stacked memory dies 106, assemble data from the stacked memory dies for transport (e.g., transport over a central bus) to a compute die, etc. In some embodiments, the additional compute dies in stack 104 may not be configured to perform any operations on the data besides I/O and assembling for transport to the base die 102. On the other hand, compute dies in stack 104 may be high performance compute dies, configured to perform various operations with respect to data stored in the stacked memory dies 106 (e.g., arithmetic and logic operations, pipelining of data from one or more of the logic dies, other memory dies, and possibly also data from external devices/chips).

In various embodiments of the present disclosure, transistors described herein may be field-effect transistors (FETs), e.g., metal oxide semiconductor (MOS) FETs (MOSFETs). In general, a FET is a three-terminal device that includes source, drain, and gate terminals and uses electric field to control current flowing through the device (e.g., through a channel portion of the transistor). A FET typically includes a channel material, a source region and a drain regions provided in and/or over the channel material, and a gate stack that includes a gate electrode material, alternatively referred to as a "work function" material, provided over a portion of the channel material (the "channel portion") between the source and the drain regions, and optionally, also includes a gate dielectric material between the gate electrode material and the channel material.

Figure 2:
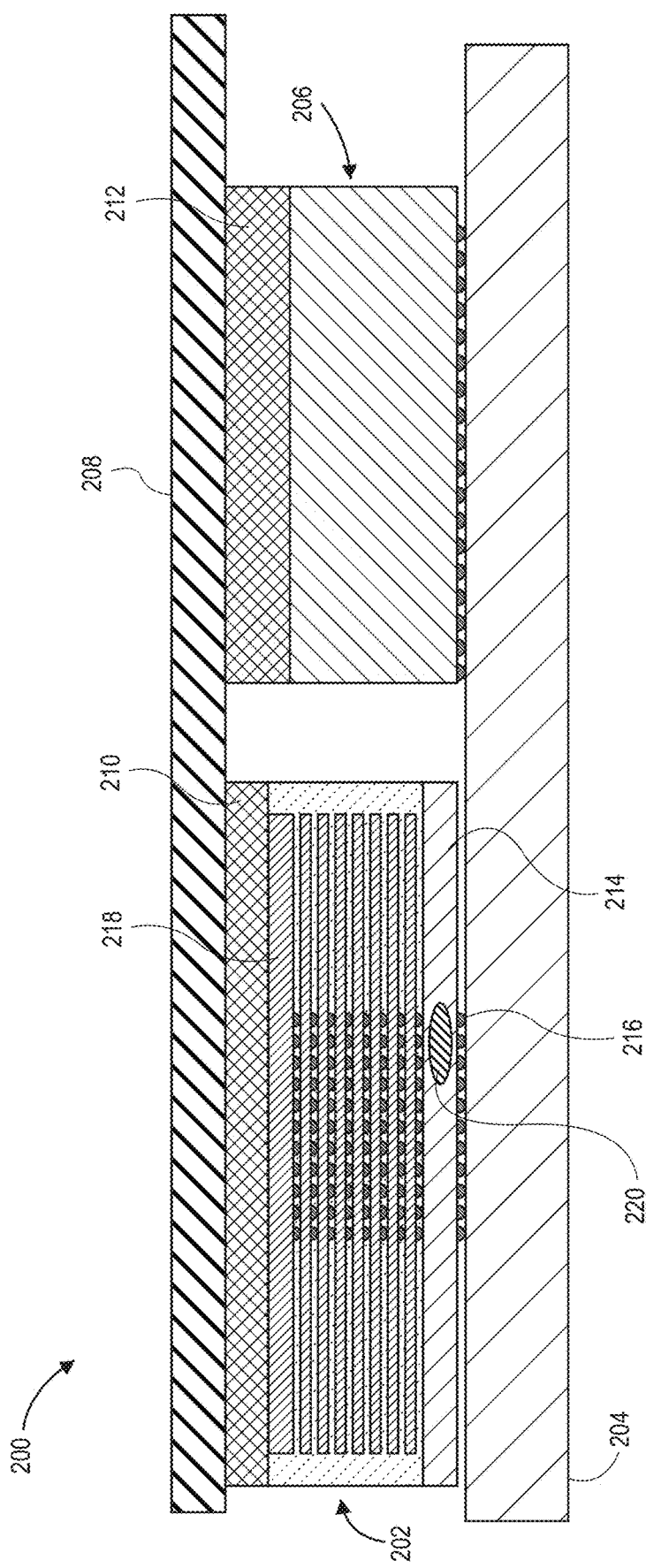
FIG. 2 is a schematic cross-sectional view of an example IC package including a microelectronic assembly such as illustrated in FIG. 1 oriented in a conventional manner.

FIG. 2 is a schematic cross-sectional illustration of a package 200 including a HBM die stack 202 oriented on a package substrate 204 in a conventional manner. For purposes of explanation, it may be assumed that HBM die stack 202 is similar in all relevant respects to microelectronic assembly 100 (FIG. 1). An IC structure 206, which may include any number of different IC devices and/or combinations of devices, is also supported on package substrate 204. Due to the small sizes and fast operating speeds of HBM die stack 202 and IC structure 206, a significant amount of heat may be generated by the devices. A thermal solution, such as an integrated heat spreader (IHS) 208 may be provided on package 200, for addressing this issue. As illustrated in FIG. 2, a thermal interface material (TIM) 210 is provided and functions as a joint between HBM die stack 202 and IHS 208. Similarly, TIM 212 is provided and functions as a joint between IC structure 206 and IHS 208. In certain embodiments, IHS 208 is formed of a metal and TIM 210, 212, may be a solder material such as indium (In).

In a conventional arrangement, such as illustrated in FIG. 2, base die 214 of HBM die stack 202 is coupled to package substrate 204 with interconnect structures 216, which may be DTPS interconnect structures. In this conventional arrangement, TIM 210 is provided on an end stack die 218 of HBM die stack 202. It will be recognized that most of the power, and therefore heat, generated by HBM die stack 202 is in the base die 214, as represented by a hot spot 220. The heat centered at or around hot spot 220 must diffuse through multiple resistive interfaces before it reaches the cooling solution including TIM 210 and IHS 208. As a result of this highly resistive thermal path, the performance of HBM die stack 202 is limited. In particular, package 200 may not be sufficiently cooled with e.g., an air-cooled heat sink (not shown) coupled to IHS 208. Even for liquid cooled packages, memory in die stack 202 of package 200 may only achieve a 2× refresh rate.

Figure 3:
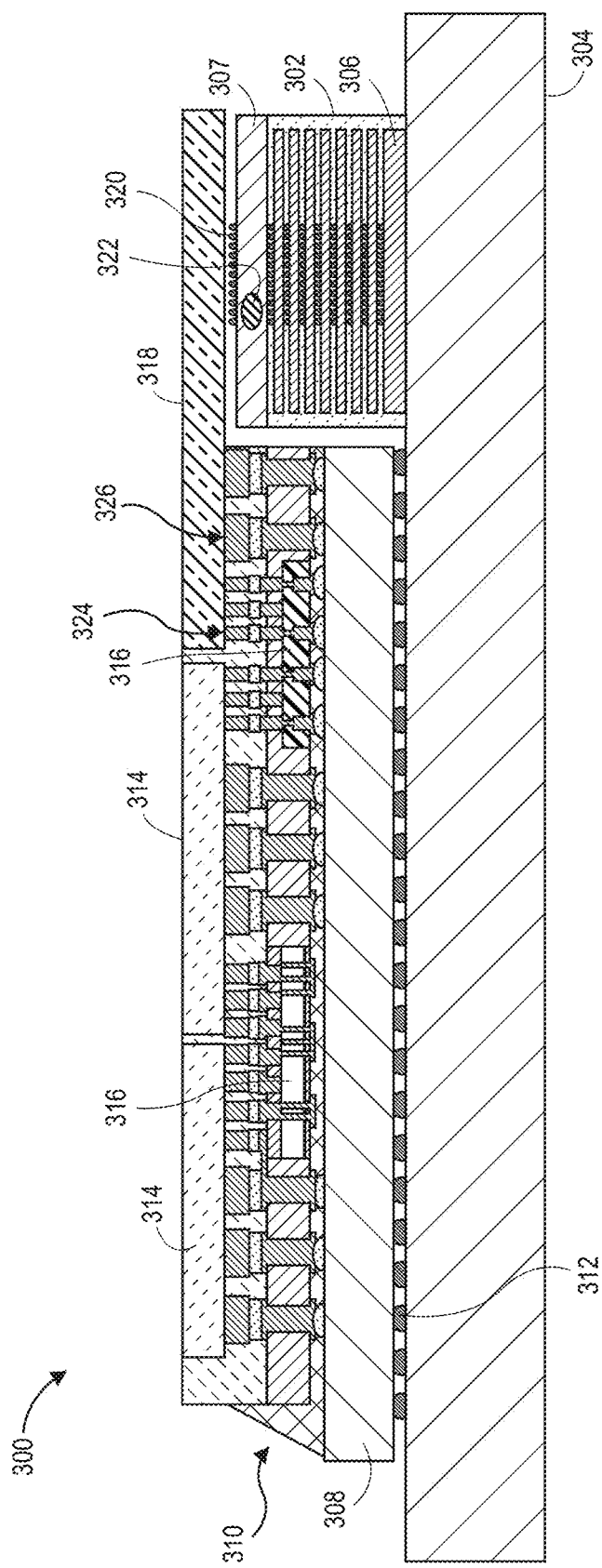
FIG. 3 is a schematic cross-sectional view of an example IC package including a microelectronic assembly such as illustrated in FIG. 1, according to some embodiments of the present disclosure.

FIG. 3 is a schematic cross-sectional illustration of a package 300, according to some embodiments of the present disclosure. As shown in FIG. 3, package 300 includes an HBM die stack 302 supported by a package substrate 304. For purposes of explanation herein, HBM die stack 302 is assumed to be similar in all relevant respects to microelectronic assembly 100 (FIG. 1) and includes an end die 306 of a stack of memory and/or compute dies stacked on a base die 307. As shown in the figures, end die 306 is the stack die distal to the base die 307. In accordance with features of embodiments described herein, HBM die stack 302 is oriented such that end die 306 is in between package substrate 304 and base die 307. In the illustrated embodiment, at least a portion of a surface of HBM die stack 302 closest to end die 306 (which may include a surface of end die) is attached to package substrate 304, e.g., using an appropriately adhesive material.

A secondary package substrate, or "interposer," 308 is provided between package substrate 304 and an IC structure 310 and is coupled to package substrate 304 with interconnects 312, which may include DTPS interconnects. IC structure 310 may include one or more IC dies 314, each of which may include electrical devices including but not limited to processing units (XPUs), electronic integrated circuits (EICs), and memory, for example.

In various embodiments, package substrate 308, also referred to as a patch substrate or interposer, may be one or more of an organic substrate including conductive traces and conductive vias, a glass substrate including conductive traces and conductive vias, a silicon substrate including at least one of a TSV, a conductive trace, a conductive via, and a dielectric layer, and/or a ceramic substrate including conductive traces and conductive vias.

In the illustrated embodiment, dies 314 may be electrically coupled by way of interconnects to one or more dies 316 between package substrate 308 and dies 314. In order to readily distinguish dies 314 from dies 316, dies 314 may be referred to herein as "top dies" or alternatively as "second-level dies," while dies 316 may be referred to herein as "embedded dies" or alternatively as "first-level dies." Dies 316, which may be substantially smaller in size than dies 314, may also be referred to as "chiplets" or "tiles". Interconnects may comprise DTD interconnects along with associated conductive traces, planes, vias, redistribution layers (RDLs), and pads enabling electrical coupling between top dies 314 and embedded dies 316. Note that some component parts of interconnects are shown in FIG. 3 but are not labeled separately so as not to clutter the drawing. In some embodiments, DTD interconnects between dies 314 and dies 316 may comprise flip-chip interconnects that enable IC structure 310 to achieve a smaller footprint and higher die-to-package-substrate connection density than could be achieved using conventional wire-bond techniques, in which conductive contacts between dies 314 and dies 316 are located on a periphery of top dies 314 and/or embedded dies 316.

In addition, by co-packaging top dies 314 with embedded dies 316 using interconnects in a high-density configuration, input/output power can be reduced by limiting electrical signaling to intra-package distances while also reducing cost and signal loss (among other advantages). The three-dimensional (3D) stacked architecture can lower power requirements for data transfer, for example, to 2-3 picojoules/bit. The high-density configuration can also enable serialization of electromagnetic signals in top dies 314, further allowing fewer number of electrical interconnects with embedded dies 316. In some example embodiments, interconnects may be formed with a high-density pitch between approximately 10 and 36 micrometer. In an example embodiment, interconnects may be formed with a high-density pitch of 25 micrometer.

In some embodiments, embedded dies 316 may comprise an IC configured to electrically integrate with one or more of top dies 314 to achieve an intended functionality of package 300. For example, embedded dies 316 may be an Application Specific IC (ASIC), such as a switch circuit or driver/receiver circuit used in optical communication systems. In some embodiments, embedded dies 316 may comprise a bridge circuit, for example, including an interconnect bridge having appropriate circuitry on/in a semiconductor substrate to connect at silicon-interconnect speeds with a small footprint as part of certain packaging architecture, for example, 3D omni-directional interconnect (ODI) packaging architecture or 2.5D packaging architecture. In some embodiments, on or more of embedded dies 316 may comprise active components, including one or more transistors, voltage converters, trans-impedance amplifiers (TIA), clock and data recovery (CDR) components, microcontrollers, etc. In some embodiments, embedded dies 316 may comprise passive circuitry sufficient to enable interconnection to or between top dies 314 and/or other components in package 100 without any active components. In some embodiments, embedded dies 316 may extend under a substantial area of top dies 314; in other embodiments, embedded dies 316 may overlap with top dies 314 along one or more edges. In various embodiments, embedded dies 316 and top dies 314 may overlap sufficiently to enable disposing interconnects with a desired pitch and number of interconnections that enable IC structure 310 to function appropriately.

In various embodiments, interposer may comprise any suitable insulating material, such as an organic material, for example, a polymer with fillers. In some embodiments, interposer may be formed of a single layer with metallization circuitry on top and bottom surfaces; in other embodiments, interposer may comprise a plurality of layers with metallization circuitry between layers. The 3D architecture as illustrated can allow a smaller footprint overall for IC structure 310.

Interconnects comprising DTPS interconnects, and associated conductive traces, planes, vias, RDLs, and pads may provide electrical coupling between embedded dies 316 and package substrate 308. Embedded dies 316 may alternatively be coupled to package substrate 308 using other means for electrically and/or physically coupling an IC to a package substrate, such as with die attach film (DAF). In various embodiments, package substrate 304 may comprise a single or multi-layered insulating material with metallization including planes, traces, vias, and passive components (e.g., inductors, capacitors) within the insulating material and/or on the surfaces. Package substrate 304 may comprise ceramic (e.g., alumina) and/or organic material (e.g., epoxy based FR4, resin based bismaleimide triazine (BT), or polyimide) and may be formed in various varieties including rigid and tape. Package substrate 304 may provide mechanical base support and appropriate interfaces to access components in package 300 electrically. Interconnects comprising DTPS interconnects, and associated conductive traces, planes, vias, RDLs, copper pillars, and pads may provide electrical coupling between top dies 314 and package substrate 304.

It will be recognized that one more levels of underfill and/or solder resist (e.g., organic polymer material such as benzotriazole, imidazole, polyimide, or epoxy) may be provided in package 300 and are not labeled in order to avoid cluttering the drawings. In various embodiments, the levels of underfill may comprise the same or different insulating materials. In some embodiments, the levels of underfill may comprise thermoset epoxies with silicon oxide particles; in some embodiments, the levels of underfill may comprise any suitable material that can perform underfill functions such as supporting the dies and reducing thermal stress on interconnects. In some embodiments, the choice of underfill material may be based on design considerations, such as form factor, size, stress, operating conditions, etc.; in other embodiments, the choice of underfill material may be based on material properties and processing conditions, such as cure temperature, glass transition temperature, viscosity and chemical resistance, among other factors; in some embodiments, the choice of underfill material may be based on both design and processing considerations. In some embodiments, solder resist may be a liquid or dry film material including photo-imageable polymers. In some embodiments, solder resist may be non-photo-imageable.

Referring again to FIG. 3, in accordance with features of embodiments described herein, an interconnect bridge 318 is provided for routing power to and I/O signals to/from HBM die stack 302. Bridge 318 is similar in all relevant respects to bridge 418 shown and described below with reference to FIGS. 4A and 4B and is connected to base die 307 of HBM die stack 302 via interconnects 320. The illustrated orientation of HBM die stack 302 (i.e., with end die 306 between package substrate 304 and base die 307) results in a hot spot 322 of HBM die stack 302 being positioned proximate a top surface of package 300, thereby improving thermal and overall performance of the HBM die stack 302 and hence package 300. I/O signals are routed between package substrate 304 and HBM die stack 302 via package substrate 308, an I/O signal interconnect structure 324, and bridge 318. Similarly, power is routed to HBM die stack 302 from package substrate 304 via package substrate 308, a power interconnect structure 326, and bridge 318. As illustrated in FIG. 3, I/O signal interconnect structure 324 may include conductive structures, such as conductive vias. Similarly, power interconnect structure 326 may include conductive structures, such as copper pillars. In certain embodiments, a diameter of I/O signal interconnect structure 324 is smaller than a diameter of power interconnect structure 326. In some embodiments, bridge 318 may include silicon. In other embodiments, bridge 318 may include a material having a higher dielectric constant than silicon. In still other embodiments, bridge 318 may include glass, mold based RDL, organic, or ceramic materials. A height, or thickness, of package substrate 308 may be appropriate to substantially align top surfaces of top dies 314 with top surface of bridge 318, as illustrated in FIG. 3. In various embodiments, a pitch of interconnect structures 320 is finer than that of interconnect structures 324, 326.

In certain embodiments, top dies 314 and bridge 318 may be encased by a mold that, in some embodiments, may extend to the surfaces of top dies 314 and bridge 318 distant from package substrate 308 without overlapping on such surfaces, thereby exposing top dies 314 and bridge 318 for direct connection of heat sinks, identifying markers, etc. In some embodiments, mold covers the surfaces of top dies 314 and bridge 318 distant from package substrate 308. In some embodiments, a thermal solution (such as TIM and an IHS as shown in FIG. 2) may be provided over package 300.

Figure 4A:
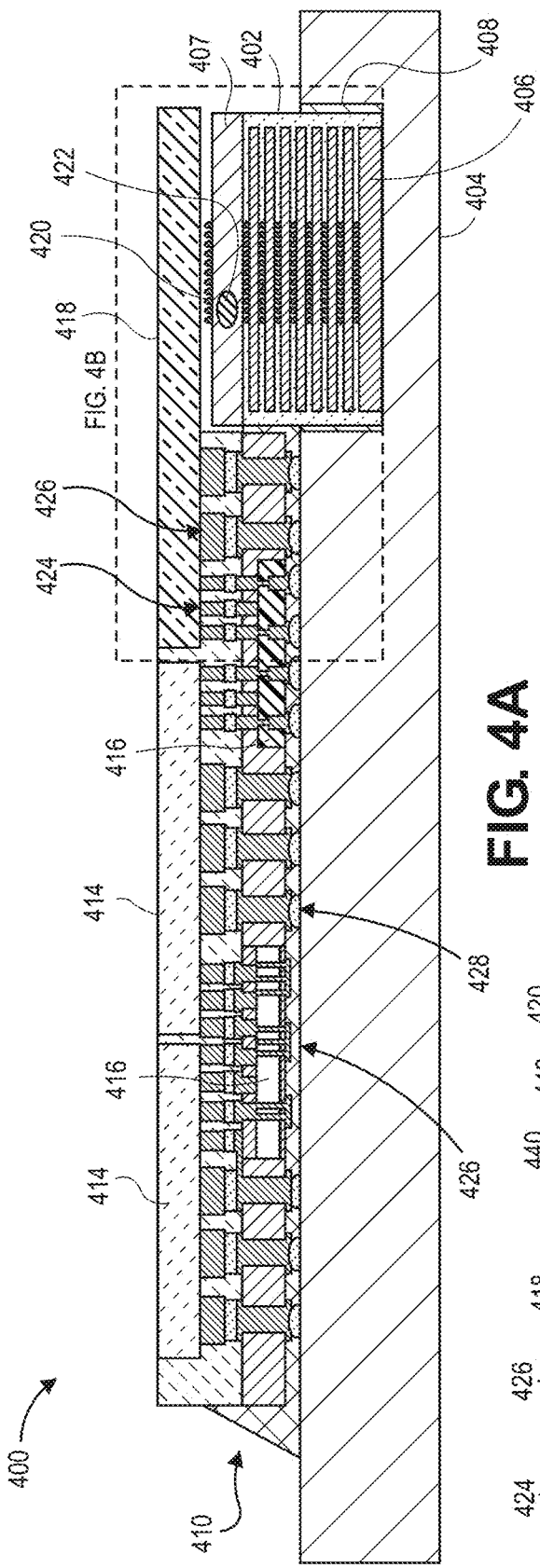
FIG. 4A is a schematic cross-sectional view of another example IC package including a microelectronic assembly such as illustrated in FIG. 1, according to some embodiments of the present disclosure.
Figure 4B:
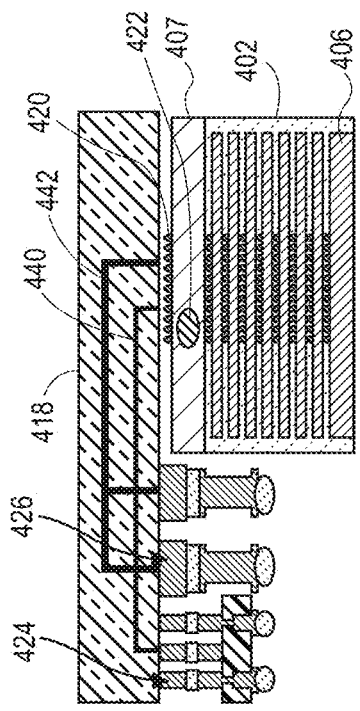
FIG. 4B is a schematic cross-sectional view of a portion of the example IC package of FIG. 4A, according to some embodiments of the present disclosure.

FIGS. 4A and 4B collectively provide a schematic cross-sectional illustration of a package 400, according to some embodiments of the present disclosure. As shown in FIG. 4A, package 400 includes an HBM die stack 402 supported by a package substrate 404. For purposes of explanation herein, HBM die stack 402 is assumed to be similar in all relevant respects to microelectronic assembly 100 (FIG. 1) and includes an end die 406 of a stack of memory and/or compute dies stacked on a base die 407. In accordance with features of embodiments described herein, HBM die stack 402 is oriented such that end die 406 is in between package substrate 404 and base die 407. In the embodiment shown in FIG. 4A, a cavity 408 is provided in package substrate 404 in for receiving at least a portion of HBM die stack 402. At least a portion of a surface of HBM die stack 402 closest to end die 406 (which may include a surface of end die) is attached to the floor of the cavity 408 provided in package substrate 404, e.g., using an appropriately adhesive material. An IC structure 410 may be coupled to package substrate 404 with interconnects, which may include DTPS interconnects. IC structure 410 may include one or more IC dies 414, each of which may include electrical devices including but not limited to processing units (XPUs), EICs, and memory, for example.

In the illustrated embodiment, dies 414 may be electrically coupled by way of interconnects to one or more dies 416 between package substrate 404 and dies 414. Interconnects may comprise DTD interconnects along with associated conductive traces, planes, vias, redistribution layers (RDLs), and pads enabling electrical coupling between top dies 414 and embedded dies 416. Note that some component parts of interconnects are shown in FIG. 4 but are not labeled separately so as not to clutter the drawing. In some embodiments, DTD interconnects between dies 414 and dies 416 may comprise flip-chip interconnects that enable IC structure 410 to achieve a smaller footprint and higher die-to-package-package substrate connection density than could be achieved using conventional wire-bond techniques.

Referring to FIGS. 4A and 4B, in accordance with features of embodiments described herein, an interconnect bridge 418 is provided for routing power to and I/O signals to/from HBM die stack 402. Bridge 418 is connected to base die 407 of HBM die stack 402 via interconnects 420. The illustrated orientation of HBM die stack 402 (i.e., with end die 406 between package substrate 404 and base die 407) results in a hot spot 422 of HBM die stack 402 being positioned proximate a top surface of package 400, thereby improving thermal and overall performance of the HBM die stack 402 and hence package 400. I/O signals are routed between package substrate 404 and HBM die stack 402 via an I/O signal interconnect structure 424, and bridge 418. Similarly, power is routed to HBM die stack 402 from package substrate 404 via a power interconnect structure 426, and bridge 418. As illustrated in FIGS. 4A and 4B, I/O signal interconnect structure 424 may include conductive structures, such as conductive vias. Similarly, power interconnect structure 426 may include conductive structures, such as copper pillars. In certain embodiments, a diameter of I/O signal interconnect structure 424 is smaller than a diameter of power interconnect structure 426. In some embodiments, bridge 418 may include silicon. In other embodiments, bridge 418 may include a material having a higher dielectric constant than silicon. In still other embodiments, bridge 418 may include glass, mold based RDL, organic, or ceramic materials. A depth of cavity 408 may be appropriate to substantially align top surfaces of top dies 414 with top surface of bridge 418, as illustrated in FIG. 4A. In various embodiments, a pitch of interconnect structures 420 is finer than that of interconnect structures 424, 426.

Referring specifically to FIG. 4B, bridge 418 may include an I/O channel 440 for interconnecting I/O signal interconnect structure 424 with HBM die stack 402 (via interconnects 420) and a power channel 442 for electrically interconnecting power interconnect structure 426 with HBM die stack 402 (via interconnects 420). For Joint Electron Device Engineering Council (JEDEC) standard generation 2 or generation 3 HBM die stacks, the signal density of the I/O channel 440 is 250-300 IO/mm with future generations of high bandwidth DRAM and possible SRAM devices is expected to be at a similar or higher wiring density scale. The I/O channel 442 can occupy one or more layers on the bridge 418 depending on the bridge 418 fabrication capabilities and signal crosstalk, resistance, and capacitance trade-offs. The device power of current and near-term generation HBM die stacks 402 has been between 15-30 W with the device utilizing 3-4 independent power rails to optimize the power and performance. The bridge 418 stack-up may be composed of 1-2 I/O channel layers with 2-4 dedicated power and ground layers. In certain embodiments, a diameter of I/O signal channel 442 is smaller than a diameter of power channel 442.

In certain embodiments, top dies 414 and bridge 418 may be encased by a mold that, in some embodiments, may extend to the surfaces of top dies 414 and bridge 418 distant from package substrate 404 without overlapping on such surfaces, thereby exposing top dies 414 and bridge 418 for direct connection of heat sinks, identifying markers, etc. In some embodiments, mold covers the surfaces of top dies 414 and bridge 418 distant from package substrate 404. In some embodiments, a thermal solution (such as TIM and an IHS as shown in FIG. 2) may be provided over package 400.

Figure 5:
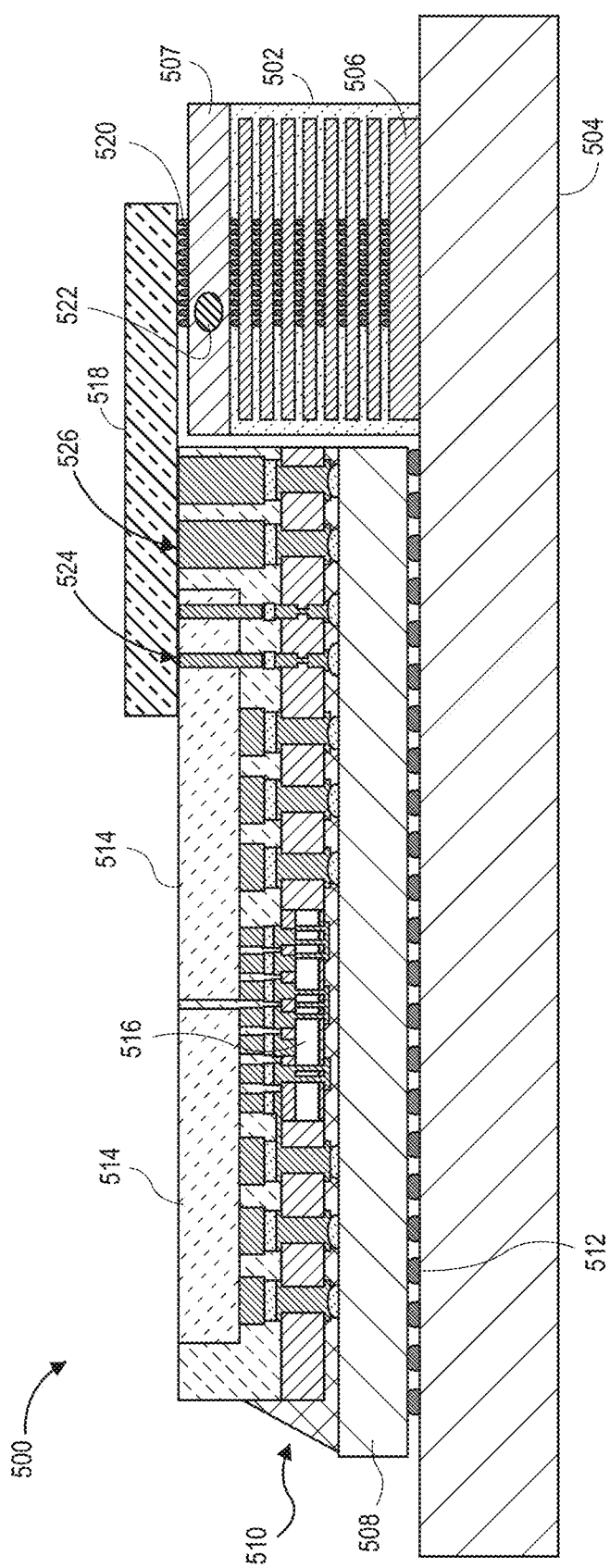
FIG. 5 is a schematic cross-sectional view of another example IC package including a microelectronic assembly such as illustrated in FIG. 1, according to some embodiments of the present disclosure.

FIG. 5 is a schematic cross-sectional illustration of a package 500, according to some embodiments of the present disclosure. As shown in FIG. 5, package 500 includes an HBM die stack 502 supported by a package substrate 504. For purposes of explanation herein, HBM die stack 502 is assumed to be similar in all relevant respects to microelectronic assembly 100 (FIG. 1) and includes an end die 506 of a stack of memory and/or compute dies stacked on a base die 507. In accordance with features of embodiments described herein, HBM die stack 502 is oriented such that end die 506 is in between package substrate 504 and base die 507. In the illustrated embodiment, at least a portion of a surface of HBM die stack 502 closest to end die 506 (which may include a surface of end die) is attached to package substrate 504, e.g., using an appropriately adhesive material.

A secondary package substrate, or interposer, 508 is provided between package substrate 504 and an IC structure 510 and is coupled to package substrate 504 with interconnects 512, which may include DTPS interconnects. IC structure 510 may include one or more IC dies 514, each of which may include electrical devices including but not limited to processing units (XPUs), EICs, and memory, for example.

In the illustrated embodiment, dies 514 may be electrically coupled by way of interconnects to one or more dies 516 between secondary package substrate 508 and dies 514. Interconnects may comprise DTD interconnects along with associated conductive traces, planes, vias, redistribution layers (RDLs), and pads enabling electrical coupling between top dies 514 and embedded dies 516. Note that some component parts of interconnects are shown in FIG. 5 but are not labeled separately so as not to clutter the drawing. In some embodiments, DTD interconnects between dies 514 and dies 516 may comprise flip-chip interconnects that enable IC structure 510 to achieve a smaller footprint and higher die-to-package-package substrate connection density than could be achieved using conventional wire-bond techniques.

As illustrated in FIG. 5, in accordance with features of embodiments described herein, an interconnect bridge 518 is provided for routing power to and I/O signals to/from HBM die stack 502. Bridge 518 is similar in all relevant respects to bridge 418 (FIGS. 4A and 4B) and is connected to base die 507 of HBM die stack 502 via interconnects 520. The illustrated orientation of HBM die stack 502 (i.e., with end stack die 506 between package substrate 504 and base die 507) results in a hot spot 522 of HBM die stack 502 being positioned proximate a top surface of package 500, thereby improving thermal and overall performance of the HBM die stack 502 and hence package 500. I/O signals are routed between package substrate 504 and HBM die stack 502 via package substrate 508, an I/O signal interconnect structure 524, and bridge 518. Similarly, power is routed to HBM die stack 502 from package substrate 504 via package substrate 508, a power interconnect structure 526, and bridge 518. As illustrated in FIG. 5, I/O signal interconnect structure 524 may include conductive structures, such as conductive vias. Similarly, power interconnect structure 526 may include conductive structures, such as copper pillars. In certain embodiments, a diameter of I/O signal interconnect structure 524 is smaller than a diameter of power interconnect structure 526. In some embodiments, bridge 518 may include silicon. In other embodiments, bridge 518 may include a material having a higher dielectric constant than silicon. In still other embodiments, bridge 518 may include glass, mold based RDL, organic, or ceramic materials. A height, or thickness, of package substrate 508 may be appropriate to elevate IC structure 510 such that bridge 518 is supported on at least a portion of a top surface of IC structure 510 and extends over base die 507 of HBM die stack 502. In various embodiments, a pitch of interconnect structures 520 is finer than that of interconnect structures 524, 526.

In certain embodiments, top dies 514 may be encased by a mold that, in some embodiments, may extend to the surfaces of top dies 514 distant from package substrate 504 without overlapping on such surfaces, thereby exposing top dies 514 for direct connection of bridge 518, for example. In some embodiments, mold covers the surfaces of top dies 514 and bridge 518 distant from package substrate 504. In some embodiments, a thermal solution (such as TIM and an IHS as shown in FIG. 2) may be provided over package 500.

FIG. 6 is a schematic cross-sectional illustration of a package 600, according to some embodiments of the present disclosure. As shown in FIG. 6, package 600 includes an HBM die stack 602 supported by a package substrate 604. For purposes of explanation herein, HBM die stack 602 is assumed to be similar in all relevant respects to microelectronic assembly 100 (FIG. 1) and includes an end die 606 of a stack of memory and/or compute dies stacked on a base die 607. In accordance with features of embodiments described herein, HBM die stack 602 is oriented such that end die 606 is in between package substrate 604 and base die 607. In the embodiment shown in FIG. 6, a cavity 608 is provided in package substrate 604 in for receiving at least a portion of HBM die stack 602. At least a portion of a surface of HBM die stack 602 closest to end die 606 (which may include a surface of end die) is attached to the floor of the cavity 608 provided in package substrate 604, e.g., using an appropriately adhesive material. An IC structure 610 may be coupled to package substrate 604 with interconnects, which may include DTPS interconnects. IC structure 610 may include one or more IC dies 614, each of which may include electrical devices including but not limited to processing units (XPUs), EICs, and memory, for example.

In the illustrated embodiment, dies 614 may be electrically coupled by way of interconnects to one or more dies 616 provided in package substrate 604. Interconnects between dies 614 and dies 616 may comprise DTD interconnects along with associated conductive traces, planes, vias, redistribution layers (RDLs), and pads enabling electrical coupling between dies 614 and dies 616. Note that some component parts of interconnects are shown in FIG. 6 but are not labeled separately so as not to clutter the drawing. In some embodiments, DTD interconnects between dies 614 and dies 616 may comprise flip-chip interconnects that enable IC structure 610 to achieve a smaller footprint and higher die-to-package-package substrate connection density than could be achieved using conventional wire-bond techniques. Additional interconnects comprising DTPS interconnects may be provided for electrically coupling dies 614 to package substrate 604.

Referring to FIG. 6, in accordance with features of embodiments described herein, an interconnect bridge 618 is provided for routing power to and I/O signals to/from HBM die stack 602. Bridge 618 similar in all relevant respects to bridge 418 (FIGS. 4A and 4B) and is connected to base die 607 of HBM die stack 602 via interconnects 620. The illustrated orientation of HBM die stack 602 (i.e., with end stack die 606 between package substrate 604 and base die 607) results in a hot spot 622 of HBM die stack 602 being positioned proximate a top surface of package 600, thereby improving thermal and overall performance of the HBM die stack 602 and hence package 600. I/O signals are routed between package substrate 604 (specifically, embedded die 616) and HBM die stack 602 via an I/O signal interconnect structure 624, and bridge 618. Similarly, power is routed to HBM die stack 602 from package substrate 604 via a power interconnect structure 626, and bridge 618. As illustrated in FIG. 6, I/O signal interconnect structure 624 may include conductive structures, such as conductive vias. Similarly, power interconnect structure 626 may include conductive structures, such as copper pillars. In certain embodiments, a diameter of I/O signal interconnect structure 624 is smaller than a diameter of power interconnect structure 626. In some embodiments, bridge 618 may include silicon. In other embodiments, bridge 618 may include a material having a higher dielectric constant than silicon. In still other embodiments, bridge 618 may include glass, mold based RDL, organic, or ceramic materials. A depth of cavity 608 may be appropriate to substantially align top surfaces of dies 614 with top surface of bridge 618, as illustrated in FIG. 6. In various embodiments, a pitch of interconnect structures 620 is finer than that of interconnect structures 624, 626.

In certain embodiments, dies 614 and bridge 618 may be encased by a mold that, in some embodiments, may extend to the surfaces of dies 614 and bridge 618 distant from package substrate 604 without overlapping on such surfaces, thereby exposing dies 614 and bridge 618 for direct connection of heat sinks, identifying markers, etc. In some embodiments, mold covers the surfaces of dies 614 and bridge 618 distant from package substrate 604. In some embodiments, a thermal solution (such as TIM and an IHS as shown in FIG. 2) may be provided over package 600.

FIG. 7 provides a schematic cross-sectional illustration of a package 700, according to some embodiments of the present disclosure. As shown in FIG. 7, package 700 includes an HBM die stack 702 supported by a package substrate 704. For purposes of explanation herein, HBM die stack 702 is assumed to be similar in all relevant respects to microelectronic assembly 100 (FIG. 1) and includes an end die 706 of a stack of memory and/or compute dies stacked on a base die 707. In accordance with features of embodiments described herein, HBM die stack 702 is oriented such that end die 706 is in between package substrate 704 and base die 707. In the embodiment shown in FIG. 7, a cavity 708 is provided in package substrate 704 in for receiving at least a portion of HBM die stack 702. At least a portion of a surface of HBM die stack 702 closest to end die 706 (which may include a surface of end die) is attached to the floor of the cavity 708 provided in package substrate 704, e.g., using an appropriately adhesive material. An IC structure 710 may be coupled to package substrate 704 with interconnects, which may include DTPS interconnects. IC structure 710 may include one or more IC dies 714, each of which may include electrical devices including but not limited to processing units (XPUs), EICs, and memory, for example.

In the illustrated embodiment, dies 714 may be electrically coupled by way of interconnects to package substrate 704, which may comprise DTPS interconnects along with associated conductive traces, planes, vias, redistribution layers (RDLs), and pads enabling electrical coupling between dies 714 and package substrate 704. Note that some component parts of interconnects are shown in FIG. 7 but are not labeled separately so as not to clutter the drawing. A passive die may be provided over at least a portion of dies 714. Although not shown, DTD interconnects may be provided between dies 714 and die 716 and may comprise flip-chip interconnects that enable IC structure 710 to achieve a smaller footprint and higher die-to-package-package substrate connection density than could be achieved using conventional wire-bond techniques.

Referring to FIG. 7, in accordance with features of embodiments described herein, an interconnect bridge 718 is provided for routing power to and I/O signals to/from HBM die stack 702. Bridge 718 is similar in all relevant respects to bridge 418 (FIGS. 4A and 4B) and is connected to base die 707 of HBM die stack 702 via interconnects 720. The illustrated orientation of HBM die stack 702 (i.e., with end stack die 706 between package substrate 704 and base die 707) results in a hot spot 722 of HBM die stack 702 being positioned proximate a top surface of package 700, thereby improving thermal and overall performance of the HBM die stack 702 and hence package 700. I/O signals are routed between package substrate 704 and HBM die stack 702 via an I/O signal interconnect structure 724, and bridge 718. Similarly, power is routed to HBM die stack 702 from package substrate 704 via a power interconnect structure 726, and bridge 718. As illustrated in FIG. 7, I/O signal interconnect structure 724 may include conductive structures, such as conductive vias. Similarly, power interconnect structure 726 may include conductive structures, such as copper pillars. In certain embodiments, a diameter of I/O signal interconnect structure 724 is smaller than a diameter of power interconnect structure 726. In some embodiments, bridge 718 may include silicon. In other embodiments, bridge 718 may include a material having a higher dielectric constant than silicon. In still other embodiments, bridge 718 may include glass, mold based RDL, organic, or ceramic materials. A depth of cavity 708 may be appropriate to substantially align top surface of passive die 716 with top surface of bridge 718, as illustrated in FIG. 7. In various embodiments, a pitch of interconnect structures 720 is finer than that of interconnect structures 724, 726.

In certain embodiments, dies 714, passive die 716, and bridge 718 may be encased by a mold that, in some embodiments, may extend to the surface of passive die 716 and bridge 718 distant from package substrate 704 without overlapping on such surfaces, thereby exposing passive die 716 and bridge 718 for direct connection of heat sinks, identifying markers, etc. In some embodiments, mold covers the surfaces of dies 716 and bridge 718 distant from package substrate 704. In some embodiments, a thermal solution (such as TIM and an IHS as shown in FIG. 2) may be provided over package 700.

Various conductive contacts used in the various packages illustrated herein may include multiple layers of material that may be selected to serve different purposes. In some embodiments, the conductive contacts may be formed of aluminum, and may include a layer of gold (e.g., with a thickness of less than 1 micrometer) between the aluminum and adjacent interconnects to limit surface oxidation of the contacts and improve adhesion with adjacent contacts. Alternate materials for the surface finish include palladium, platinum, silver, and tin. In some embodiments, the conductive contacts may be formed of aluminum, and may include a layer of a barrier metal such as nickel, as well as a layer of gold, or other appropriate material, wherein the layer of barrier metal is disposed between aluminum and gold, and the layer of gold is disposed between the barrier metal and the adjacent interconnect. In such embodiments, the gold, or other surface finish, may protect the barrier metal surface from oxidation before assembly, and the barrier metal may limit diffusion of solder from the adjacent interconnects into aluminum. In many embodiments, surfaces of dies in contact with solder may be covered by a suitable solder mask material (not shown) that prevents solder from melting and bridging adjacent contacts during solder reflow.

In various embodiments, more or fewer elements described above may be included in a package, compared to what is shown in the corresponding figure. In some embodiments, conductive metallization lines may extend into and out of the plane of the drawing, providing conductive pathways to route electrical to and/or from various elements in the package. The conductive vias and/or lines that provide conductive pathways in/on the package may be formed using any suitable techniques. Examples of such techniques may include subtractive fabrication techniques, additive or semi-additive fabrication techniques, single Damascene fabrication techniques, dual Damascene fabrication techniques, or any other suitable techniques. In some embodiments, layers of insulator material, such as oxide material or nitride material, may insulate various structures in the conductive pathways from proximate structures, and/or may serve as etch stops during fabrication. In some embodiments, additional layers, such as diffusion barrier layers or/and adhesion layers may be disposed between conductive material and proximate insulating material. Diffusion barrier layers may reduce diffusion of the conductive material into the insulating material. Adhesion layers may improve mechanical adhesion between the conductive material and the insulating material.

Note that in the figures, interconnects may be shown aligned with vias merely for illustrative purposes. In various embodiments, appropriate conductive traces may allow for some interconnects, such as solder balls, to be located away from vias and vice versa. In some embodiments, a redistribution layer comprising at least one layer of an insulating material and metallization on dies may enable any desired placement of solder balls with respect to vias and other circuitry. In a general sense, interconnect structures may be arranged within a package to route electrical signals according to a wide variety of designs. During operation of a package, electrical signals (such as power, input/output (I/O) signals, including various control signals for external and internal control of dies) may be routed to and/or from dies through the conductive contacts and conductive pathways of the package.

Note that figures intend to show relative arrangements of the components within their assemblies, and that, in general, such assemblies may include other components that are not illustrated (e.g., various interfacial layers or various other components related to functionality, electrical connectivity, or thermal mitigation). For example, in some further embodiments, the assemblies as shown in the figures may include more or fewer dies along with other electrical components.

Additionally, although some components of the assemblies are illustrated in the figures as being planar rectangles or formed of rectangular solids, this is simply for ease of illustration, and embodiments of these assemblies may be curved, rounded, or otherwise irregularly shaped as dictated by and sometimes inevitable due to the manufacturing processes used to fabricate various components.

In various embodiments, any of the features discussed with reference to the figures herein may be combined with any other features to form a package as described herein, for example, to form modified packages. Some such combinations are described above, but, in various embodiments, further combinations and modifications are possible.

Example Devices and Components

Figure 8:
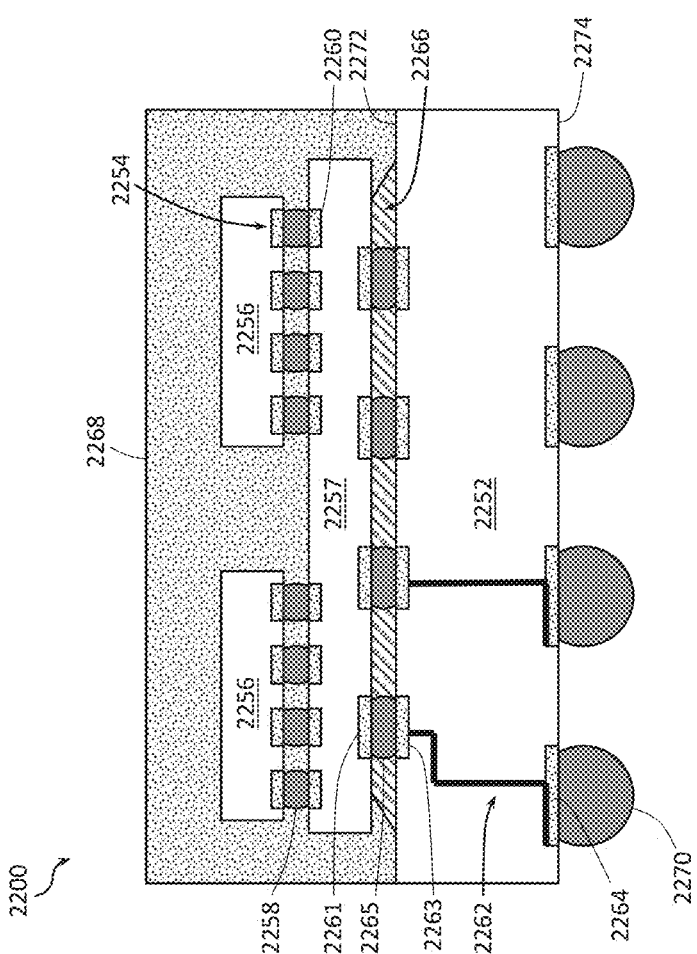
FIG. 8 is a cross-sectional view of a device package that may include one or more packages including an organic passivation layer on which die-to-die (DTD) interconnect bumps are formed, according to some embodiments of the present disclosure.
Figure 9:
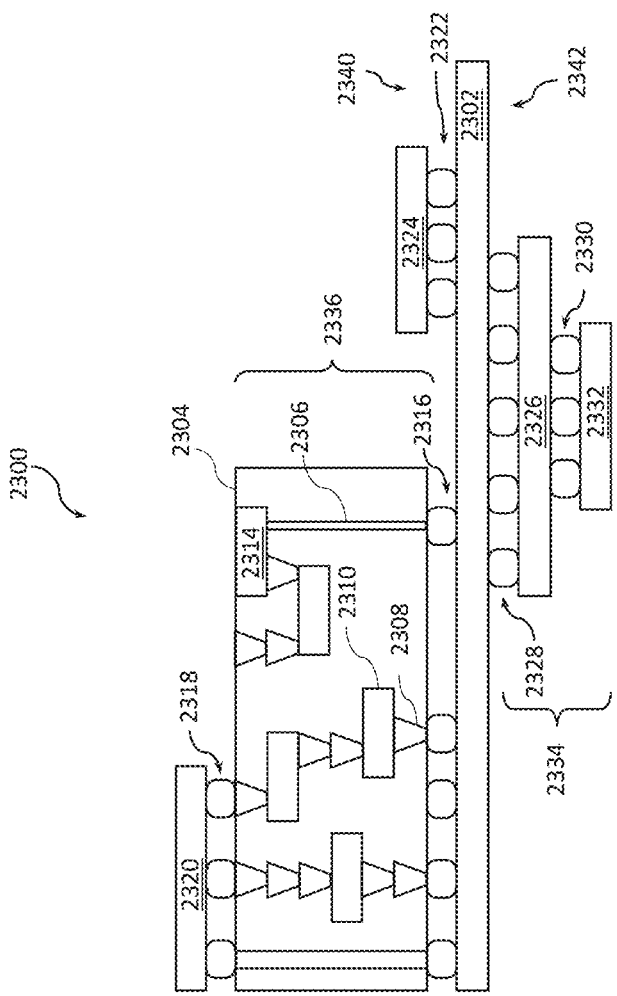
FIG. 9 is a cross-sectional side view of a device assembly that may include one or more packages including an organic passivation layer on which DTD interconnect bumps are formed, according to some embodiments of the present disclosure.
Figure 10:
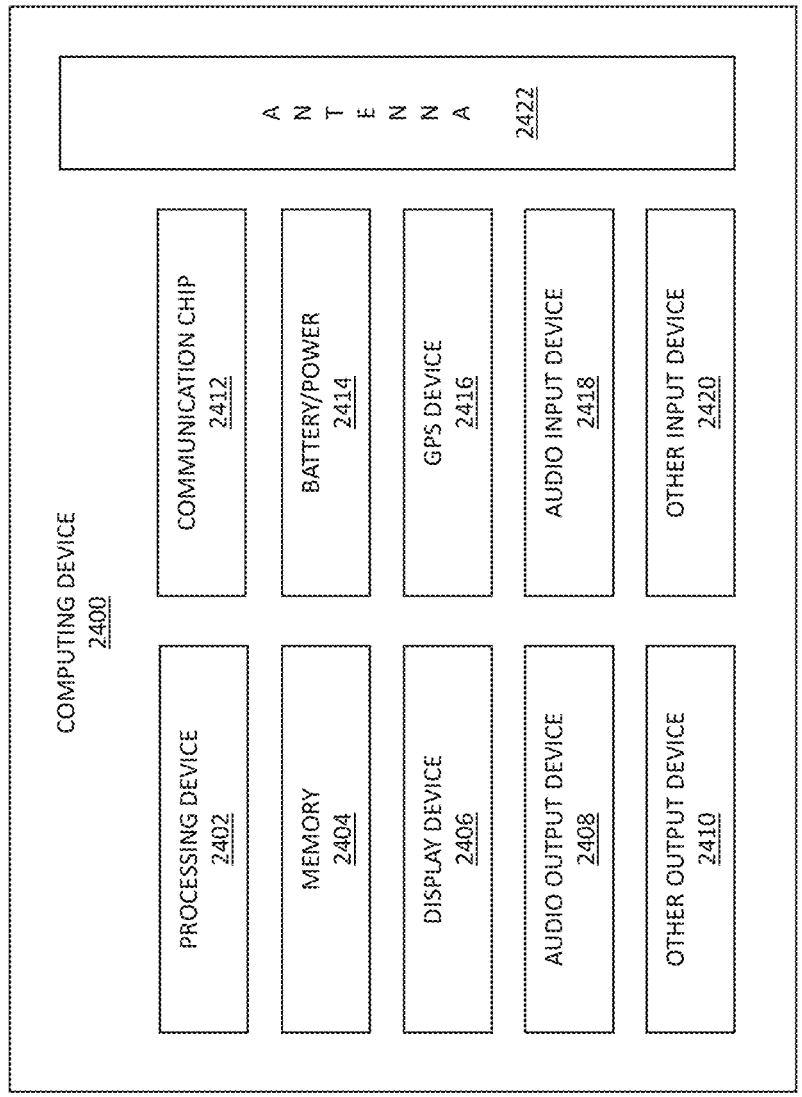
FIG. 10 is a block diagram of an example computing device that may include one or more packages including an organic passivation layer on which DTD interconnect bumps are formed, according to some embodiments of the present disclosure.

The package components disclosed herein, e.g., any of the embodiments shown in the figures or any further embodiments described herein, may be included in any suitable component. FIGS. 8-10 illustrate various examples of packages, assemblies, and devices that may be used with or include any of the package components as disclosed herein.

FIG. 8 is a side, cross-sectional view of an example IC package 2200 that may include package components in accordance with any of the embodiments disclosed herein. In some embodiments, the IC package 2200 may be a system-in-package (SiP).

As shown in FIG. 8, package substrate 2252 may be formed of an insulating material (e.g., a ceramic, a build-up film, an epoxy film having filler particles therein, etc.), and may have conductive pathways extending through the insulating material between first face 2272 and second face 2274, or between different locations on first face 2272, and/or between different locations on second face 2274. These conductive pathways may take the form of any of the interconnect structures comprising lines and/or vias, e.g., as discussed above with reference to the figures.

Package substrate 2252 may include conductive contacts 2263 that are coupled to conductive pathways 2262 through package substrate 2252, allowing circuitry within dies 2256 and/or interposer 2257 to electrically couple to various ones of conductive contacts 2264 (or to other devices included in package substrate 2252, not shown).

IC package 2200 may include interposer 2257 coupled to package substrate 2252 via conductive contacts 2261 of interposer 2257, first-level interconnects 2265, and conductive contacts 2263 of package substrate 2252. First-level interconnects 2265 illustrated in FIG. 8 are solder bumps, but any suitable first-level interconnects 2265 may be used, such as solder bumps, solder posts, or bond wires.

IC package 2200 may include one or more dies 2256 coupled to interposer 2257 via conductive contacts 2254 of dies 2256, first-level interconnects 2258, and conductive contacts 2260 of interposer 2257. Conductive contacts 2260 may be coupled to conductive pathways (not shown) through interposer 2257, allowing circuitry within dies 2256 to electrically couple to various ones of conductive contacts 2261 (or to other devices included in interposer 2257, not shown). First-level interconnects 2258 illustrated in FIG. 8 are solder bumps, but any suitable first-level interconnects 2258 may be used, such as solder bumps, solder posts, or bond wires. As used herein, a "conductive contact" may refer to a portion of electrically conductive material (e.g., metal) serving as an interface between different components; conductive contacts may be recessed in, flush with, or extending away from a surface of a component, and may take any suitable form (e.g., a conductive pad or socket).

In some embodiments, underfill material 2266 may be disposed between package substrate 2252 and interposer 2257 around first-level interconnects 2265, and mold 2268 may be disposed around dies 2256 and interposer 2257 and in contact with package substrate 2252. In some embodiments, underfill material 2266 may be the same as mold 2268. Example materials that may be used for underfill material 2266 and mold 2268 are epoxies as suitable. Second-level interconnects 2270 may be coupled to conductive contacts 2264. Second-level interconnects 2270 illustrated in FIG. 8 are solder balls (e.g., for a ball grid array (BGA) arrangement), but any suitable second-level interconnects 2270 may be used (e.g., pins in a pin grid array arrangement or lands in a land grid array arrangement). Second-level interconnects 2270 may be used to couple IC package 2200 to another component, such as a circuit board (e.g., a motherboard), an interposer, or another IC package, as known in the art and as discussed below with reference to FIG. 9.

In embodiments in which IC package 2200 includes multiple dies 2256, IC package 2200 may be referred to as a multi-chip package (MCP). Dies 2256 may include circuitry to perform any desired functionality. For example, one or more of dies 2256 may be logic dies (e.g., silicon-based dies), one or more of dies 2256 may be memory dies (e.g., HBM), etc.

Although IC package 2200 illustrated in FIG. 8 is a flip-chip package, other package architectures may be used. For example, IC package 2200 may be a BGA package, such as an embedded wafer-level ball grid array (eWLB) package. In another example, IC package 2200 may be a wafer-level chip scale package (WLCSP) or a panel fan-out (FO) package. Although two dies 2256 are illustrated in IC package 2200, IC package 2200 may include any desired number of dies 2256. IC package 2200 may include additional passive components, such as surface-mount resistors, capacitors, and inductors disposed over first face 2272 or second face 2274 of package substrate 2252, or on either face of interposer 2257. More generally, IC package 2200 may include any other active or passive components known in the art.

In some embodiments, no interposer 2257 may be included in IC package 2200; instead, dies 2256 may be coupled directly to conductive contacts 2263 at first face 2272 by first-level interconnects 2265.

FIG. 9 is a cross-sectional side view of an IC device assembly 2300 that may include components having one or more package components 100 in accordance with any of the embodiments disclosed herein. IC device assembly 2300 includes a number of components disposed over a circuit board 2302 (which may be, e.g., a motherboard). IC device assembly 2300 includes components disposed over a first face 2340 of circuit board 2302 and an opposing second face 2342 of circuit board 2302; generally, components may be disposed over one or both faces 2340 and 2342. In particular, any suitable ones of the components of IC device assembly 2300 may include any of the one or more package components 100 in accordance with any of the embodiments disclosed herein; e.g., any of the IC packages discussed below with reference to IC device assembly 2300 may take the form of any of the embodiments of IC package 2200 discussed above with reference to FIG. 8.

In some embodiments, circuit board 2302 may be a printed circuit board (PCB) including multiple metal layers separated from one another by layers of insulating material and interconnected by electrically conductive vias. Any one or more of the metal layers may be formed in a desired circuit pattern to route electrical signals (optionally in conjunction with other metal layers) between the components coupled to circuit board 2302. In other embodiments, circuit board 2302 may be a non-PCB package substrate.

FIG. 9 illustrates that, in some embodiments, IC device assembly 2300 may include a package-on-interposer structure 2336 coupled to first face 2340 of circuit board 2302 by coupling components 2316. Coupling components 2316 may electrically and mechanically couple package-on-interposer structure 2336 to circuit board 2302, and may include solder balls (as shown), male and female portions of a socket, an adhesive, an underfill material, and/or any other suitable electrical and/or mechanical coupling structure.

Package-on-interposer structure 2336 may include IC package 2320 coupled to interposer 2304 by coupling components 2318. Coupling components 2318 may take any suitable form depending on desired functionalities, such as the forms discussed above with reference to coupling components 2316. In some embodiments, IC package 2320 may be or include IC package 2200, e.g., as described above with reference to FIG. 8. In some embodiments, IC package 2320 may include at least one package component 100 as described herein. Package component 100 is not specifically shown in FIG. 9 in order to not clutter the drawing.

Although a single IC package 2320 is shown in FIG. 9, multiple IC packages may be coupled to interposer 2304; indeed, additional interposers may be coupled to interposer 2304. Interposer 2304 may provide an intervening package substrate used to bridge circuit board 2302 and IC package 2320. Generally, interposer 2304 may redistribute a connection to a wider pitch or reroute a connection to a different connection. For example, interposer 2304 may couple IC package 2320 to a BGA of coupling components 2316 for coupling to circuit board 2302.

In the embodiment illustrated in FIG. 9, IC package 2320 and circuit board 2302 are attached to opposing sides of interposer 2304. In other embodiments, IC package 2320 and circuit board 2302 may be attached to a same side of interposer 2304. In some embodiments, three or more components may be interconnected by way of interposer 2304.

Interposer 2304 may be formed of an epoxy resin, a fiberglass-reinforced epoxy resin, a ceramic material, or a polymer material such as polyimide. In some implementations, interposer 2304 may be formed of alternate rigid or flexible materials that may include the same materials described above for use in a semiconductor substrate, such as silicon, germanium, and other group III-V and group IV materials. Interposer 2304 may include metal interconnects 2308 and vias 2310, including but not limited to TSVs 2306. Interposer 2304 may further include embedded devices 2314, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio frequency (RF) devices, power amplifiers, power management devices, antennas, arrays, sensors, and microelectromechanical systems (MEMS) devices may also be formed on interposer 2304. Package-on-interposer structure 2336 may take the form of any of the package-on-interposer structures known in the art.

In some embodiments, IC device assembly 2300 may include an IC package 2324 coupled to first face 2340 of circuit board 2302 by coupling components 2322. Coupling components 2322 may take the form of any of the embodiments discussed above with reference to coupling components 2316, and IC package 2324 may take the form of any of the embodiments discussed above with reference to IC package 2320.

In some embodiments, IC device assembly 2300 may include a package-on-package structure 2334 coupled to second face 2342 of circuit board 2302 by coupling components 2328. Package-on-package structure 2334 may include an IC package 2326 and an IC package 2332 coupled together by coupling components 2330 such that IC package 2326 is disposed between circuit board 2302 and IC package 2332. Coupling components 2328 and 2330 may take the form of any of the embodiments of coupling components 2316 discussed above, and IC packages 2326 and/or 2332 may take the form of any of the embodiments of IC package 2320 discussed above. Package-on-package structure 2334 may be configured in accordance with any of the package-on-package structures known in the art.

FIG. 10 is a block diagram of an example computing device 2400 that may include one or more package components in accordance with any of the embodiments disclosed herein. For example, any one or more of the components of computing device 2400 may include any embodiments of IC package 2200 (e.g., as shown in FIG. 8). In yet another example, any one or more of the components of computing device 2400 may include an IC device assembly 2300 (e.g., as shown in FIG. 9).

A number of components are illustrated in FIG. 10 as included in computing device 2400, but any one or more of these components may be omitted or duplicated, as suitable for the application. In some embodiments, some or all of the components included in computing device 2400 may be attached to one or more motherboards. In some embodiments, some or all of these components are fabricated onto a single SoC die.

Additionally, in various embodiments, computing device 2400 may not include one or more of the components illustrated in FIG. 10, but computing device 2400 may include interface circuitry for coupling to the one or more components. For example, computing device 2400 may not include a display device 2406, but may include display device interface circuitry (e.g., a connector and driver circuitry) to which display device 2406 may be coupled. In another set of examples, computing device 2400 may not include an audio input device 2418 or an audio output device 2408 but may include audio input or output device interface circuitry (e.g., connectors and supporting circuitry) to which audio input device 2418 or audio output device 2408 may be coupled.

Computing device 2400 may include a processing device 2402 (e.g., one or more processing devices). As used herein, the term "processing device" or "processor" may refer to any device or portion of a device that processes electronic data from registers and/or memory to transform that electronic data into other electronic data that may be stored in registers and/or memory. Processing device 2402 may include one or more digital signal processors (DSPs), ASICs, CPUs, GPUs, cryptoprocessors (specialized processors that execute cryptographic algorithms within hardware), server processors, or any other suitable processing devices. Computing device 2400 may include a memory 2404, which may itself include one or more memory devices such as volatile memory (e.g., DRAM), nonvolatile memory (e.g., read-only memory (ROM)), flash memory, solid state memory, and/or a hard drive. In some embodiments, memory 2404 may include memory that shares a die with processing device 2402. This memory may be used as cache memory and may include embedded DRAM (eDRAM) or spin transfer torque magnetic random access memory (STT-MRAM).

In some embodiments, computing device 2400 may include a communication chip 2412 (e.g., one or more communication chips). For example, communication chip 2412 may be configured for managing wireless communications for the transfer of data to and from computing device 2400. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

Communication chip 2412 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultramobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 2412 may operate in accordance with a Global System for Mobile Communication (GSM), General Packet Radio Service (GPRS), Universal Mobile Telecommunications System (UMTS), High-Speed Packet Access (HSPA), Evolved HSPA (E-HSPA), or LTE network. The communication chip 2412 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). Communication chip 2412 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. Communication chip 2412 may operate in accordance with other wireless protocols in other embodiments. Computing device 2400 may include an antenna 2422 to facilitate wireless communications and/or to receive other wireless communications (such as AM or FM radio transmissions).

In some embodiments, communication chip 2412 may manage wired communications, such as electrical, optical, or any other suitable communication protocols (e.g., the Ethernet). As noted above, communication chip 2412 may include multiple communication chips. For instance, a first communication chip 2412 may be dedicated to shorter-range wireless communications such as Wi-Fi or Bluetooth, and a second communication chip 2412 may be dedicated to longer-range wireless communications such as global positioning system (GPS), EDGE, GPRS, CDMA, WiMAX, LTE, EV-DO, or others. In some embodiments, a first communication chip 2412 may be dedicated to wireless communications, and a second communication chip 2412 may be dedicated to wired communications.

Computing device 2400 may include battery/power circuitry 2414. Battery/power circuitry 2414 may include one or more energy storage devices (e.g., batteries or capacitors) and/or circuitry for coupling components of computing device 2400 to an energy source separate from computing device 2400 (e.g., AC line power).

Computing device 2400 may include a display device 2406 (or corresponding interface circuitry, as discussed above). Display device 2406 may include any visual indicators, such as a heads-up display, a computer monitor, a projector, a touchscreen display, a liquid crystal display (LCD), a light-emitting diode display, or a flat panel display, for example.

Computing device 2400 may include audio output device 2408 (or corresponding interface circuitry, as discussed above). Audio output device 2408 may include any device that generates an audible indicator, such as speakers, headsets, or earbuds, for example.

Computing device 2400 may include audio input device 2418 (or corresponding interface circuitry, as discussed above). Audio input device 2418 may include any device that generates a signal representative of a sound, such as microphones, microphone arrays, or digital instruments (e.g., instruments having a musical instrument digital interface (MIDI) output).

Computing device 2400 may include a GPS device 2416 (or corresponding interface circuitry, as discussed above). GPS device 2416 may be in communication with a satellite-based system and may receive a location of computing device 2400, as known in the art.

Computing device 2400 may include other output device 2410 (or corresponding interface circuitry, as discussed above). Examples of other output device 2410 may include an audio codec, a video codec, a printer, a wired or wireless transmitter for providing information to other devices, or an additional storage device.

Computing device 2400 may include other input device 2420 (or corresponding interface circuitry, as discussed above). Examples of other input device 2420 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

Computing device 2400 may have any desired form factor, such as a handheld or mobile computing device (e.g., a cell phone, a smart phone, a mobile internet device, a music player, a tablet computer, a laptop computer, a netbook computer, an ultrabook computer, a personal digital assistant (PDA), an ultramobile personal computer, etc.), a desktop computing device, a server or other networked computing component, a printer, a scanner, a monitor, a set-top box, an entertainment control unit, a vehicle control unit, a digital camera, a digital video recorder, or a wearable computing device. In some embodiments, computing device 2400 may be any other electronic device that processes data.

Select Examples

The following paragraphs provide various examples of the embodiments disclosed herein.

Example 1 provides a microelectronic assembly, including a package substrate; an HBM die stack on the package substrate, the HBM die stack including a first die including logic for HBM operations; and a second die between the first die and the package substrate, the second die including at least one of a compute die and a memory die; a bridge electrically coupled to the first die of the HBM; and an IC assembly on the package substrate, the IC assembly including an interposer between the bridge and the package substrate and electrically coupling the bridge and the package substrate; and a third die in the interposer, the bridge electrically coupled to the third die.

Example 2 provides the microelectronic assembly of example 1, where at least a portion of the first die of the HBM die stack is between at least a portion of the bridge and the package substrate.

Example 3 provides the microelectronic assembly of any of examples 1-2, where the bridge connects to the first die of the HBM die stack with interconnect structures including a power interconnect structure and an I/O signal interconnect structure.

Example 4 provides the microelectronic assembly of example 3, where the power interconnect structure includes a pillar between the package substrate and the bridge, and the I/O signal interconnect structure includes a pillar between the package substrate and the bridge.

Example 5 provides the microelectronic assembly of example 4, where the pillars include copper.

Example 6 provides the microelectronic assembly of example 4, where a diameter the pillar including the power interconnect structure is greater than a diameter of the pillar including the I/O signal interconnect structure.

Example 7 provides the microelectronic assembly of any of examples 1-2, where the bridge includes silicon.

Example 8 provides the microelectronic assembly of any of examples 1-2, where the bridge includes a material having a higher dielectric constant than silicon.

Example 9 provides the microelectronic assembly of any of examples 1-2, where the bridge includes glass.

Example 10 provides the microelectronic assembly of any of examples 1-2, where the bridge includes a mold material.

Example 11 provides the microelectronic assembly of any of examples 1-2, where the bridge includes an organic material.

Example 12 provides the microelectronic assembly of any of examples 1-2, where the bridge includes a ceramic material.

Example 13 provides the microelectronic assembly of any of examples 1-2, where at least a portion of the second die is attached to the package substrate.

Example 14 provides the microelectronic assembly of example 13, where the at least a portion of the second die is attached to the package substrate with a material including adhesive.

Example 15 provides the microelectronic assembly of any of examples 1-2, where the package substrate includes a cavity, and at least a portion of the HBM die stack is within the cavity.

Example 16 provides the microelectronic assembly of example 15, where the at least a portion of the HBM die stack is secured within the cavity with a material including adhesive.

Example 17 provides the microelectronic assembly of any of examples 1-2, further including a secondary package substrate between the package substrate and the IC assembly.

Example 18 provides the microelectronic assembly of example 17, where the secondary package substrate includes an organic material and at least one of a conductive trace and a conductive via.

Example 19 provides the microelectronic assembly of example 17, where the secondary package substrate includes glass and at least one of a conductive trace and a conductive via.

Example 20 provides the microelectronic assembly of example 17, where the secondary package substrate includes silicon and at least one of a TSV, a conductive trace, a conductive via, and a dielectric layer.

Example 21 provides the microelectronic assembly of example 20, where the substrate includes active components.

Example 22 provides the microelectronic assembly of example 20, where the substrate is passive.

Example 23 provides the microelectronic assembly of example 17, where the secondary package substrate includes ceramic and at least one of a conductive trace and a conductive via.

Example 24 provides the microelectronic assembly of any of examples 1-2, where the package substrate is an interposer.

Example 25 provides the microelectronic assembly of any of examples 1-2, where at least one of the interconnect structures includes a first structure bonded to a second structure with solder material, where the first and second structures include copper.

Example 26 provides the microelectronic assembly of any of examples 1-2, where at least one of the interconnect structures includes a first structure directly bonded to a second structure, where the first and second structures include copper.

Example 27 provides the microelectronic assembly of any of examples 1-2, where at least one of the interconnect structures includes at least one of copper, silver, nickel, cobalt, tin, lead, and solder material.

Example 28 provides the microelectronic assembly of any of examples 1-2, where the IC assembly includes a fourth die, where the interposer is between the fourth die and the package substrate, the fourth die electrically connected to the third die in the interposer.

Example 29 provides the microelectronic assembly of example 28, where a surface of the fourth die is substantially coplanar with a surface of the bridge.

Example 30 provides the microelectronic assembly of any of examples 1-2, further including an IHS, where the first die is between the IHS and the second die.

Example 31 provides the microelectronic assembly of example 30, further including TIM between the IHS and the first die.

Example 32 provides an IC package, including a package substrate; an HBM die stack, the HBM die stack including a first die including logic for HBM operations; and a plurality of second dies stacked between the first die and the package substrate, where an end one of the second dies is attached to a portion of the package substrate; and a bridge electrically connected to the first die of the HBM die stack with interconnect structures, the bridge including a power channel and an I/O signal channel, and where at least a portion of the HBM die stack is between at least a portion of the bridge and the package substrate.

Example 33 provides the IC package of example 32, where the interconnect structures include a power interconnect structure and an I/O signal interconnect structure.

Example 34 provides the IC package of example 33, where a diameter of the power interconnect structure is greater than a diameter of the I/O signal interconnect structure.

Example 35 provides the IC package of any of examples 32-34, where at least a portion of the HBM die stack is in a cavity provided in a surface of the package substrate.

Example 36 provides the IC package of example 35, where the end one of the second dies is attached to the package substrate within the cavity.

Example 37 provides the IC package of example 36, where at least a portion of the end one of the second dies is attached to the package substrate with a material including adhesive.

Example 38 provides the IC package of any of examples 32-34, further including an IC assembly over a second portion of the package substrate.

Example 39 provides the IC package of example 38, where the IC assembly includes a third die; and a fourth die electrically connected to the third die, where the third die is between the package substrate and the fourth die.

Example 40 provides the IC package of example 38, where at least a portion of the IC assembly is between at least a portion of the bridge and the package assembly.

Example 41 provides the IC package of example 38, further including a secondary package substrate between the package substrate and the IC assembly.

Example 42 provides the IC package of example 41, where the secondary package substrate includes an organic material and at least one of a conductive trace and a conductive via.

Example 43 provides the IC package of example 41, where the secondary package substrate includes glass and at least one of a conductive trace and a conductive via.

Example 44 provides the IC package of example 41, where the secondary package substrate includes silicon and at least one of a TSV, a conductive trace, a conductive via, and a dielectric layer.

Example 45 provides the IC package of example 41, where the secondary package substrate includes ceramic and at least one of a conductive trace and a conductive via.

Example 46 provides the IC package of any of examples 32-34, further including an IHS, where the first die is between the IHS and the plurality of second dies.

Example 47 provides the IC package of example 46, further including TIM between the IHS and the first die.

Example 48 provides the IC package of any of examples 32-34, where the end one of the second dies is attached to the portion of the package substrate with a material including an adhesive.

Example 49 provides a method of fabricating a microelectronic assembly, the method including attaching a portion of an HBM die stack to a surface of a package substrate, where the HBM die stack includes a base die and a stack of dies over the base die, and where the portion of the HBM die stack attached to the surface of the package substrate includes a surface of the HBM die stack including at least a portion of an end die of the stack of dies; and providing a bridge structure, where at least a portion of the base die of the HBM die stack is between the stack of dies and the bridge structure, where the bridge structure is connected to the base die of the HBM die stack with interconnect structures including a power interconnect structure and an I/O signal interconnect structure.

Example 50 provides the method of example 49, further including prior to attaching the HBM die stack, providing a cavity in the package substrate.

Example 51 provides the method of example 50 further including attaching the HBM die stack to the package substrate so that at least a portion of the HBM die stack is within the cavity.

Example 52 provides the method of any of examples 49-51, where the package substrate includes a primary package substrate, the method further including providing a secondary package substrate on at least a portion of the primary package substrate.

Example 53 provides the method of example 52, further including providing an IC assembly between at least a portion of the secondary package substrate and at least a portion of the bridge.

Example 54 provides the method of any of examples 49-51, where a surface of the bridge structure is substantially coplanar with a surface of the IC assembly.

Example 55 provides the method of any of examples 49-51, where at least a portion of the IC assembly is between the package substrate and at least a portion of the bridge structure.

Example 56 provides the method of any of examples 49-51, further including providing an IHS, where the base die is between the IHS and the stack of dies.

Example 57 provides the method of example 55, further including providing a TIM, where the TIM is between the IHS and the base die.

Example 58 provides the method of any of examples 49-51, where the stack of dies includes at least one of a compute die and a memory die.

Example 59 provides a microelectronic assembly, including a substrate; a bridge die over the substrate; and a die stack between the substrate and the bridge die, where the die stack includes a logic die and at least one memory die and the logic die is between the at least one memory die and the bridge die.

Example 60 provides the microelectronic assembly of example 59, where the substrate includes a recess, and where the die stack is at least partially in the recess.

Example 61 provides the microelectronic assembly of example 60, further including adhesive material between the die stack and at least part of the recess.

Example 62 provides the microelectronic assembly of any of examples 59-61, where the substrate includes a first substrate, the microelectronic assembly further including a second substrate located adjacent to the die stack and between the first substrate and the bridge die.

Example 63 provides the microelectronic assembly of any of examples 59-61, further including a first plurality of interconnects conductively coupling the bridge die to the logic die, the first plurality of interconnects having a first pitch; and a second plurality of interconnects conductively coupling the bridge die to the substrate, the second plurality of interconnects having a second pitch, where the second pitch is larger than the first pitch.

Example 64 provides the microelectronic assembly of any of examples 59-61, further including a die located adjacent the bridge die.

Example 65 provides the microelectronic assembly of any of examples 59-61, where the bridge die includes at least one of silicon, a material having a higher dielectric constant than silicon, glass, mold, an organic material, and a ceramic material.

Example 66 provides the microelectronic assembly of any of examples 59-61, where the substrate is a primary substrate, the microelectronic assembly further including a secondary substrate between the substrate and the IC assembly, the secondary substrate including at least one of an organic material and at least one of a conductive trace and a conductive via, glass and at least one of a conductive trace and a conductive via, silicon and at least one of a TSV, a conductive trace, a conductive via, and a dielectric layer, and ceramic and at least one of a conductive trace and a conductive via.

Example 67 provides the microelectronic assembly of any of examples 59-61, further including an IHS, where the logic die is between the IHS and the at least one memory die.

The above description of illustrated implementations of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

The invention claimed is:

1. An integrated circuit (IC) package, comprising:
    a first package substrate;
    a die stack comprising:
        a first die, and
        a plurality of second dies stacked between the first die and the first package substrate, wherein an end one of the second dies is attached to a first portion of the first package substrate;
    a bridge coupled to the first die with interconnect structures, wherein at least a portion of the die stack is between at least a portion of the bridge and at least a portion of the first package substrate; and
    an IC assembly over a second portion of the first package substrate, the IC assembly comprising:
        a third die, and
        a fourth die coupled to the third die, wherein the third die is between the first package substrate and the fourth die; and
    a second package substrate between the first package substrate and the IC assembly, the second package substrate comprising:
        a conductive via, and
        at least one of: an organic material, a glass material, a material comprising silicon, and a ceramic material.

2. The IC package of claim 1, wherein the interconnect structures include a first interconnect structure and a second interconnect structure and wherein a diameter of the first interconnect structure is greater than a diameter of the second interconnect structure.

3. The IC package of claim 2, wherein the first interconnect structure is a power interconnect structure, and the second interconnect structure is a signal interconnect structure.

4. The IC package of claim 1, wherein at least a portion of the die stack is in a cavity in a surface of the first package substrate and wherein the end one of the second dies is attached to the first package substrate within the cavity.

5. The IC package of claim 1, wherein at least a portion of the IC assembly is between at least a portion of the bridge and the first package substrate.

6. The IC package of claim 1, further comprising an integrated heat spreader (IHS), wherein the first die is between the IHS and the plurality of second dies.

7. The IC package of claim 1, wherein the end one of the second dies is attached to the portion of the first package substrate with an adhesive.

8. The IC package of claim 1, wherein the die stack is a high bandwidth memory (HBM) die stack.

9. The IC package of claim 8, wherein the bridge includes a power channel and an input/output (I/O) signal channel.

10. The IC package of claim 1, wherein the second package substrate further includes a conductive trace.

11. A method of fabricating a microelectronic assembly, the method comprising:
    attaching a portion of a die stack to a surface of a first package substrate, wherein the die stack comprises a base die and an end die and wherein the portion of the die stack attached to the surface of the first package substrate comprises a surface of the die stack comprising at least a portion of the end die; and
    providing a second package substrate on at least a portion of the first package substrate;
    providing a bridge structure over at least a portion of the base die of the die stack, the bridge structure coupled to the base die of the die stack with interconnect structures comprising a power interconnect structure and an input/output (I/O) signal interconnect structure; and providing an integrated circuit (IC) assembly between at least a portion of the second package substrate and at least a portion of the bridge.

12. The method of claim 11, further comprising:
prior to attaching the die stack, providing a cavity in the first package substrate; and
attaching the die stack to the first package substrate so that at least a portion of the die stack is within the cavity.

13. An integrated circuit (IC) package, comprising:
a package substrate;
a bridge die;
a first die stack over a first portion of the package substrate, the first die stack comprising a first plurality of dies, wherein a bottom die of the first plurality of dies is attached to the package substrate, and a top die of the first plurality of dies is coupled to the bridge die; and
a second die stack over a second portion of the package substrate, the second die stack comprising a second plurality of dies, wherein a bottom die of the second plurality of dies is coupled to the package substrate, a top die of the second plurality of dies is coupled to the bridge die, and a distance between the bridge die and a bottom surface of the bottom die of the first plurality of dies is greater than a distance between the bridge die and a bottom surface of the bottom die of the second plurality of dies.

14. The IC package of claim 13, wherein the bottom die of the second plurality of dies is coupled to the package substrate by conductive interconnects between the bottom surface of the bottom die of the second plurality of dies and the package substrate.

15. The IC package of claim 13, wherein the first die stack is at least partially in a recess in the package substrate.

16. The IC package of claim 13, wherein the bottom die of the first plurality of dies is attached to the package substrate by an adhesive.

17. The IC package of claim 13, wherein the package substrate is a first package substrate, and the IC package further includes a second package substrate between the first package substrate and the second die stack.

18. The IC package of claim 17, wherein the distance between the bridge die and the bottom surface of the bottom die of the first plurality of dies is greater than a distance between the bridge die and a bottom surface of the second package substrate.

19. The IC package of claim 17, wherein the second package substrate includes at least one of:
an organic material and at least one of a conductive trace and a conductive via,
glass and at least one of a conductive trace and a conductive via,
silicon and at least one of a TSV, a conductive trace, a conductive via, and a dielectric layer, and
ceramic and at least one of a conductive trace and a conductive via.

20. The IC package of claim 17, wherein the second package substrate includes a conductive via and at least one of: an organic material, a glass material, a material comprising silicon, and a ceramic material.

* * * * *

UNITED STATES PATENT AND TRADEMARK OFFICE
CERTIFICATE OF CORRECTION

PATENT NO. : 12,347,780 B2
APPLICATION NO. : 17/475726
DATED : July 1, 2025
INVENTOR(S) : Krishna Vasanth Valavala et al.

Page 1 of 1

It is certified that error appears in the above-identified patent and that said Letters Patent is hereby corrected as shown below:

In the Claims

In Column 30, Claim 1, Line 15, delete "substrate; and" and insert -- substrate; --, therefor.

In Column 30, Claim 11, Line 63, delete "die; and" and insert -- die; --, therefor.

Signed and Sealed this
Fifth Day of August, 2025

Coke Morgan Stewart
*Acting Director of the United States Patent and Trademark Office*